(12) United States Patent
Murray et al.

(10) Patent No.: US 11,929,436 B2
(45) Date of Patent: Mar. 12, 2024

(54) THIN TRANSISTOR INCLUDING A HYDROGEN-BLOCKING DIELECTRIC BARRIER AND METHODS FOR FORMING THE SAME

(71) Applicant: Taiwan Semiconductor Manufacturing Company Limited, Hsinchu (TW)

(72) Inventors: Neil Murray, Hsinchu (TW); Hung-Wei Li, Hsinchu (TW); Mauricio Manfrini, Zhubei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 223 days.

(21) Appl. No.: 17/467,478

(22) Filed: Sep. 7, 2021

(65) Prior Publication Data

US 2022/0246767 A1 Aug. 4, 2022

Related U.S. Application Data

(60) Provisional application No. 63/144,493, filed on Feb. 2, 2021.

(51) Int. Cl.
    *H01L 29/66*    (2006.01)
    *H01L 21/02*    (2006.01)
    *H01L 29/786*   (2006.01)

(52) U.S. Cl.
    CPC .. *H01L 29/78606* (2013.01); *H01L 21/02178* (2013.01); *H01L 21/02565* (2013.01); *H01L 29/66969* (2013.01); *H01L 29/7869* (2013.01)

(58) Field of Classification Search
    CPC ......... H01L 21/02178; H01L 21/02565; H01L 21/021189; H01L 29/78606;
    (Continued)

(56) References Cited

U.S. PATENT DOCUMENTS

2018/0212062 A1    8/2018  Xie et al.
2023/0027402 A1*   1/2023  Yamazaki ........... H01L 21/8234

FOREIGN PATENT DOCUMENTS

CN    102315277 A    1/2012
CN    105070715 A    11/2015
(Continued)

OTHER PUBLICATIONS

Taiwan Patent Office; Application No. 111100640; Office Action dated Jan. 30, 2023, 13 pages.
(Continued)

*Primary Examiner* — Nikolay K Yushin
(74) *Attorney, Agent, or Firm* — The Marbury Law Group, PLLC

(57) ABSTRACT

A thin film transistor includes an insulating matrix layer including an opening therein, a hydrogen-blocking dielectric barrier layer continuously extending over a bottom surface and sidewalls of the opening and over a top surface of the insulating matrix layer, a gate electrode located within the opening, a stack of a gate dielectric and a semiconducting metal oxide plate overlying the gate electrode and horizontally-extending portions of the hydrogen-blocking dielectric barrier layer that overlie the insulating matrix layer, and a source electrode and a drain electrode contacting a respective portion of a top surface of the semiconducting metal oxide plate.

20 Claims, 29 Drawing Sheets

(58) Field of Classification Search
CPC ............... H01L 29/66969; H01L 29/66; H01L 29/7869; H01L 29/786; H01L 29/42384; H01L 29/423; H01L 29/42364; H01L 29/51; H01L 21/02; H01L 29/66742

See application file for complete search history.

(56) References Cited

FOREIGN PATENT DOCUMENTS

| | | | | |
|---|---|---|---|---|
| JP | 2020-002997 | * | 1/2022 | ......... H01L 21/0262 |
| KR | 20200125572 A | | 11/2020 | |
| KR | 20200127010 A | | 11/2020 | |

OTHER PUBLICATIONS

Korean Patent Office; Application No. 10-2022-0012973; Office Action dated Nov. 20, 2023, 16 pages.

* cited by examiner

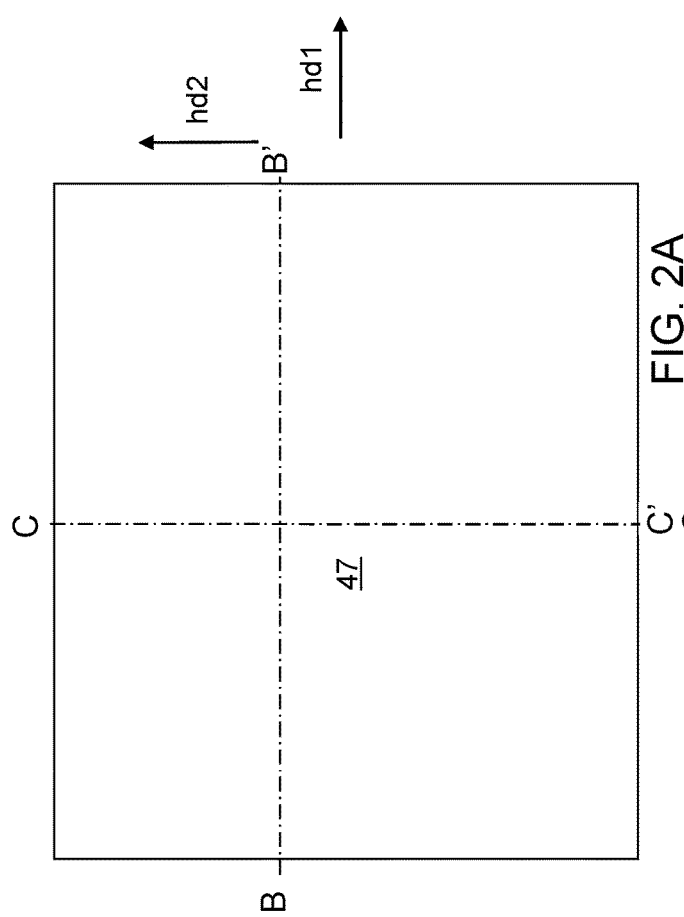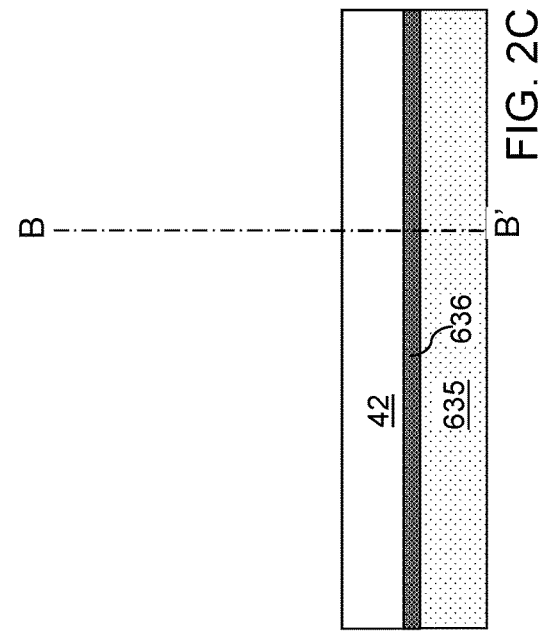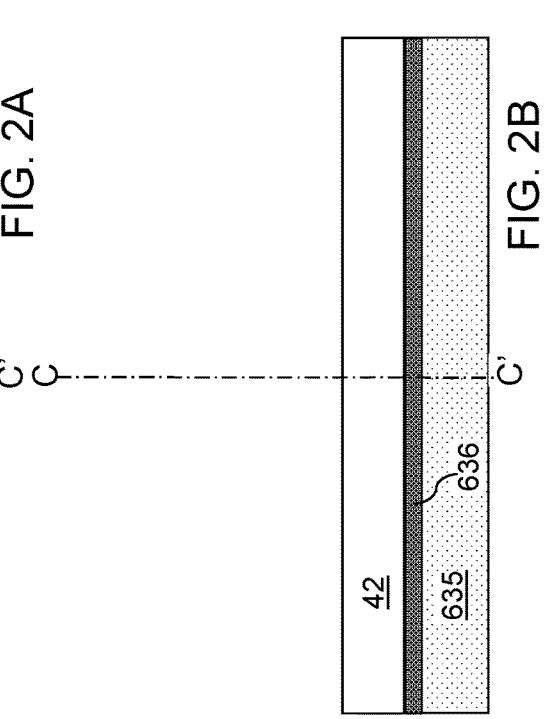

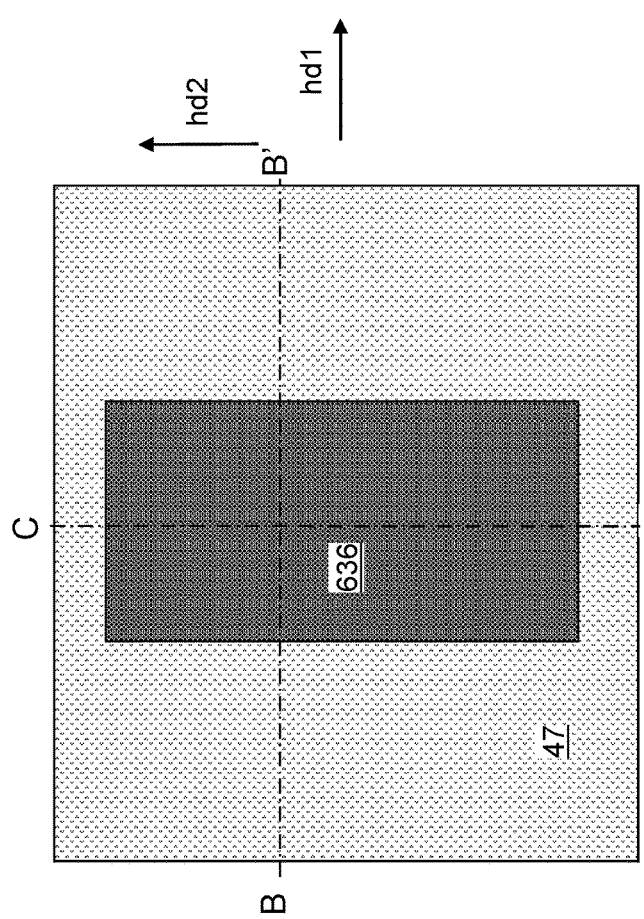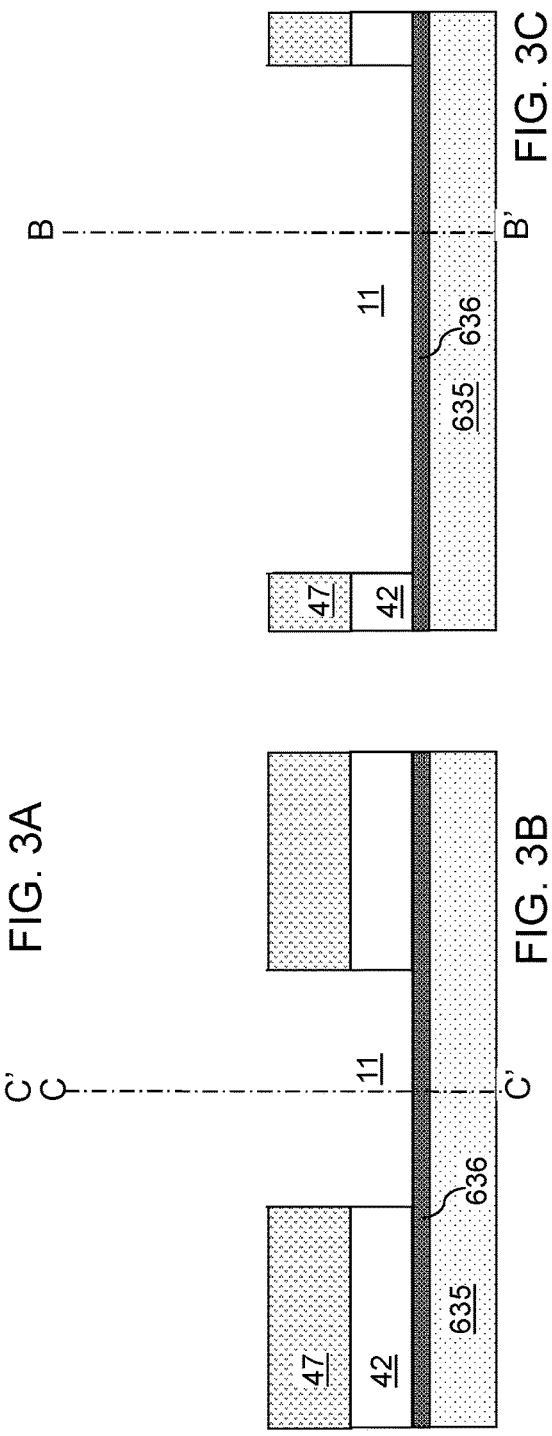

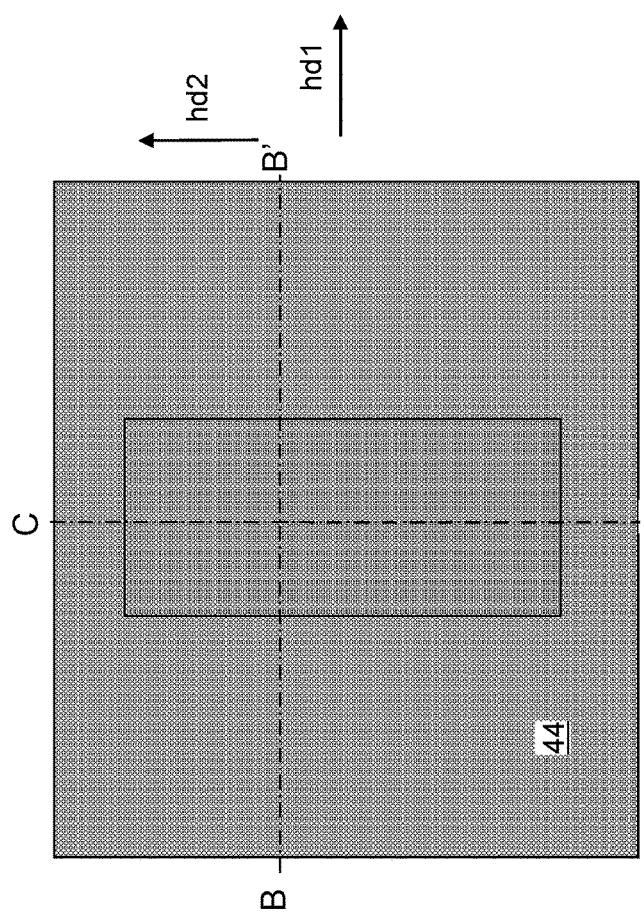
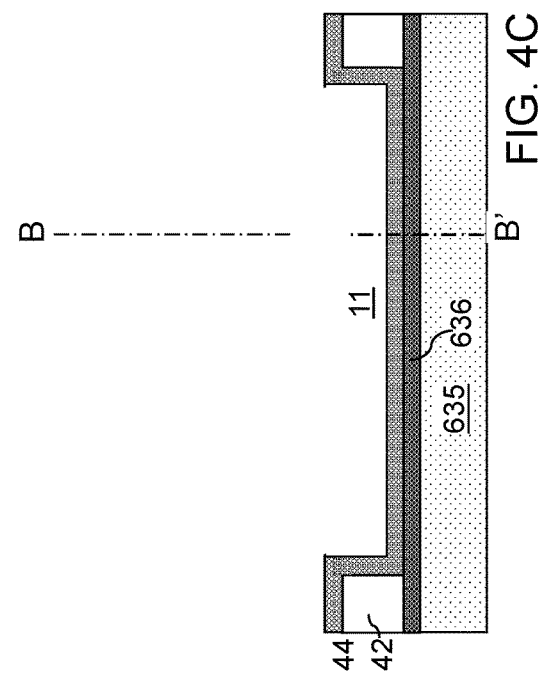
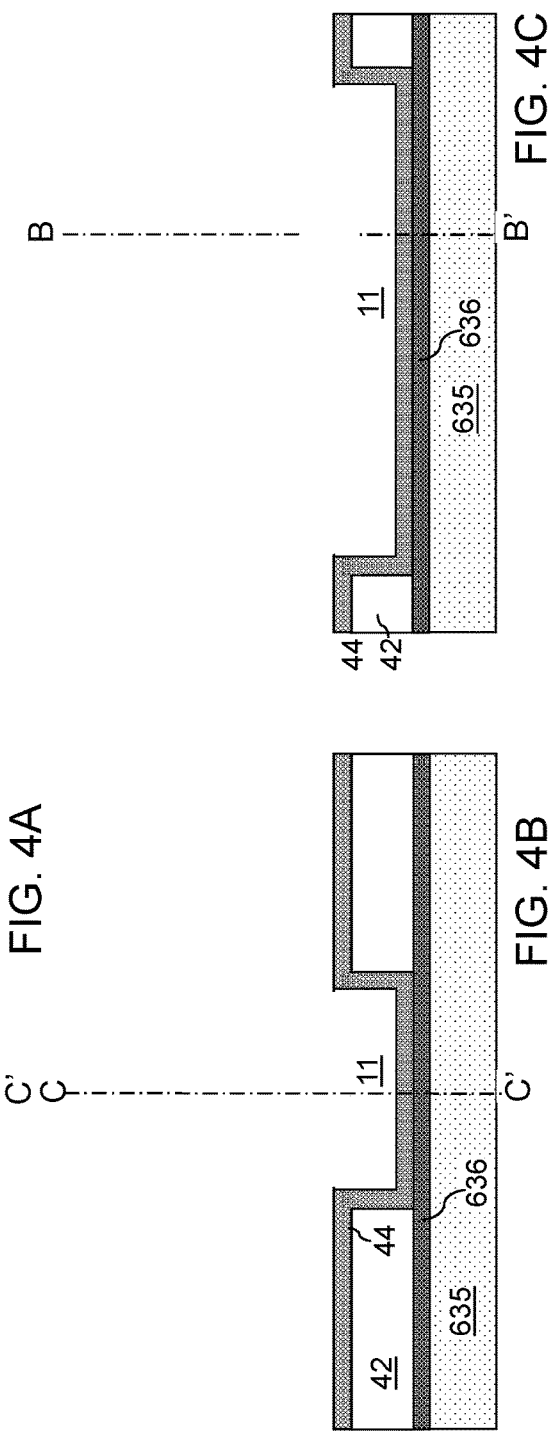

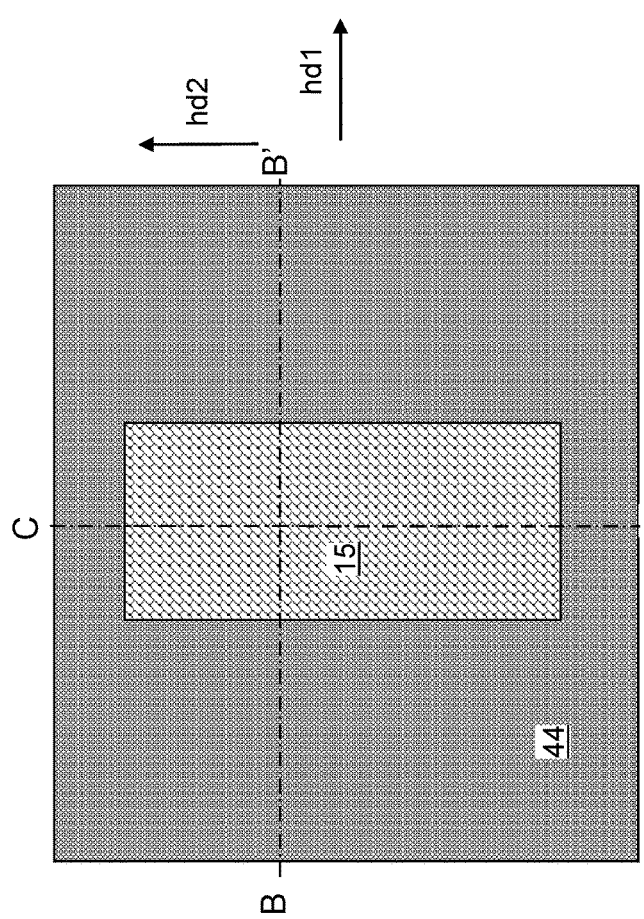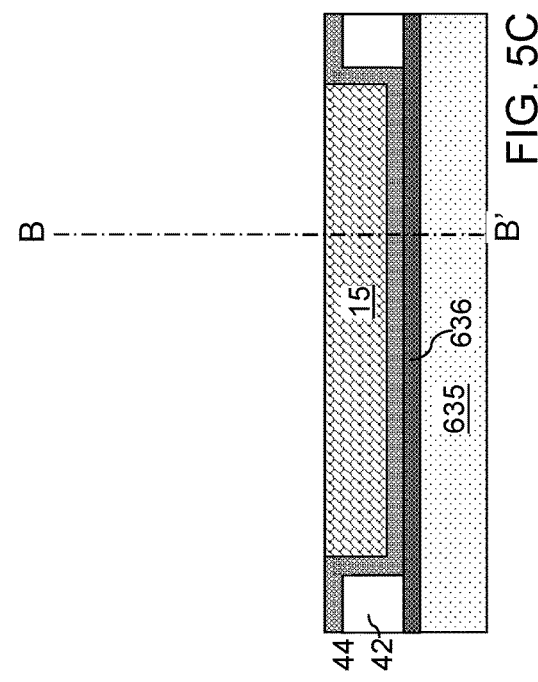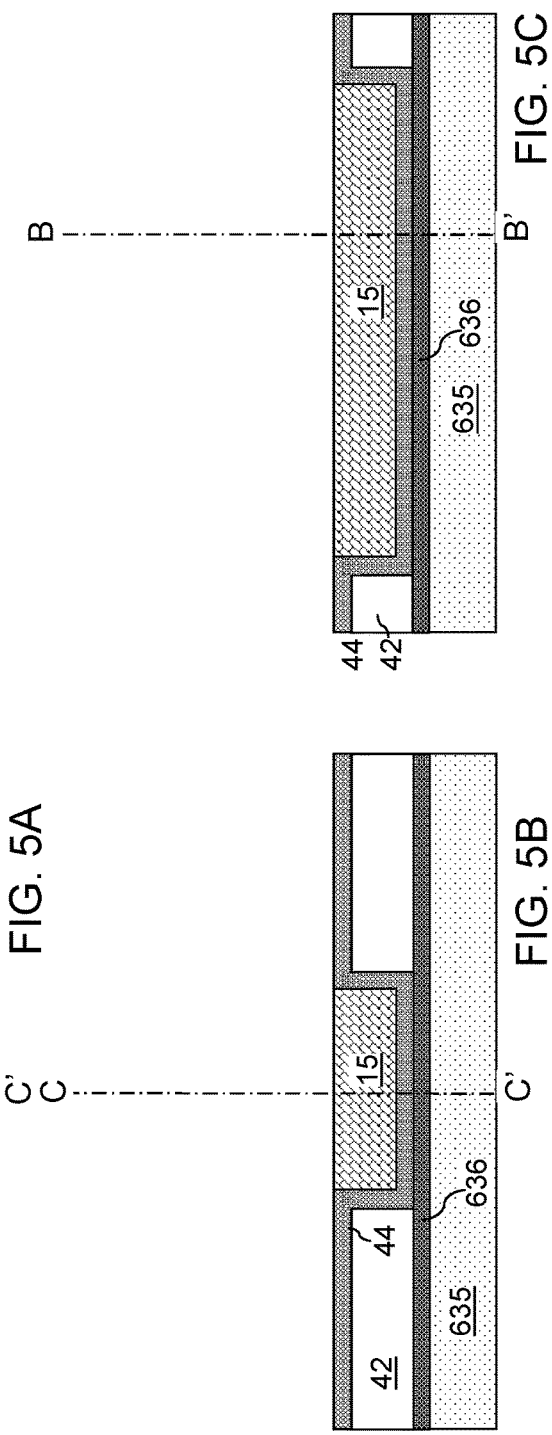

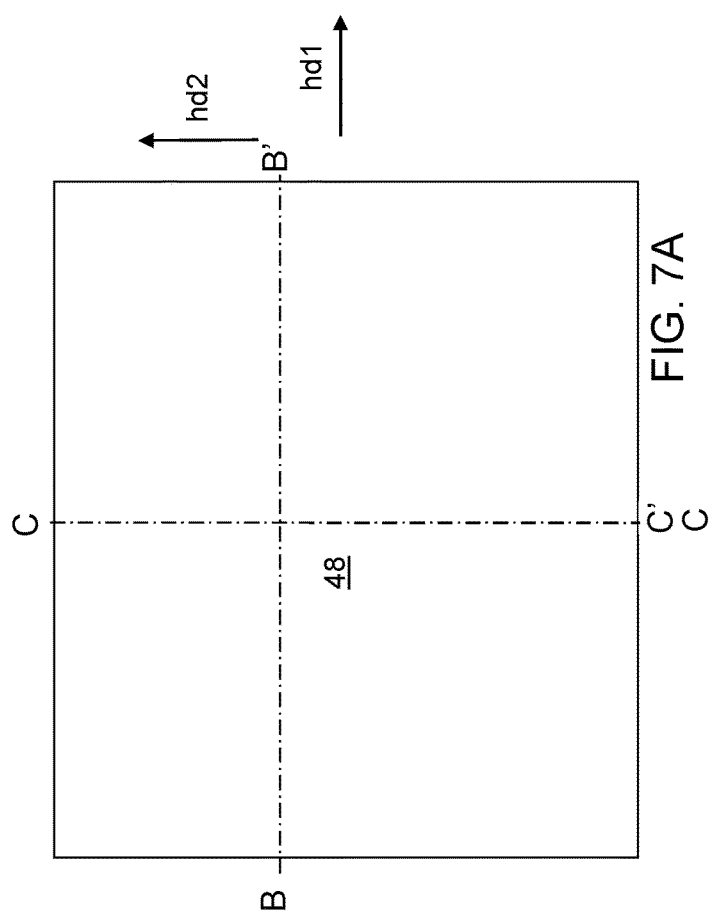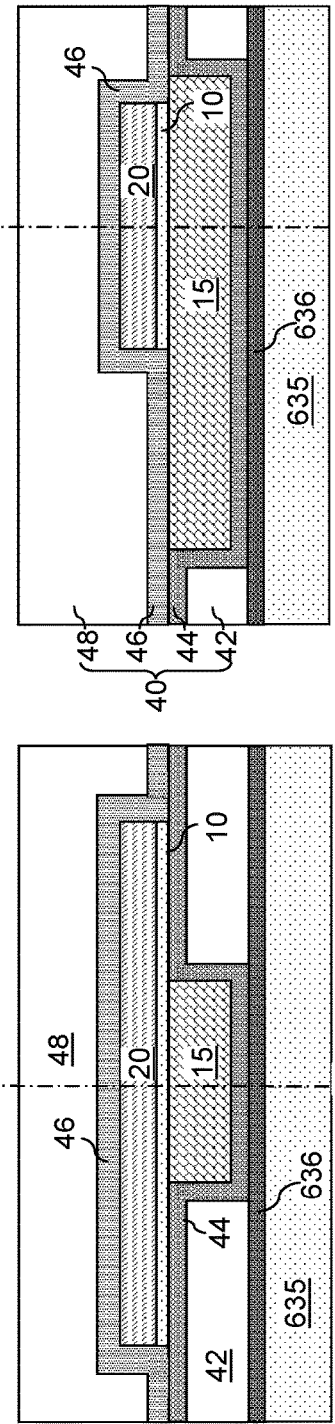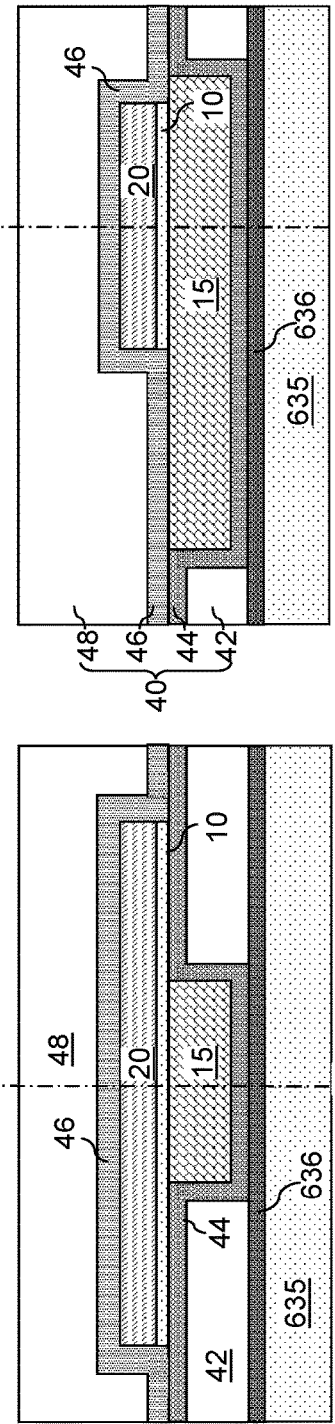

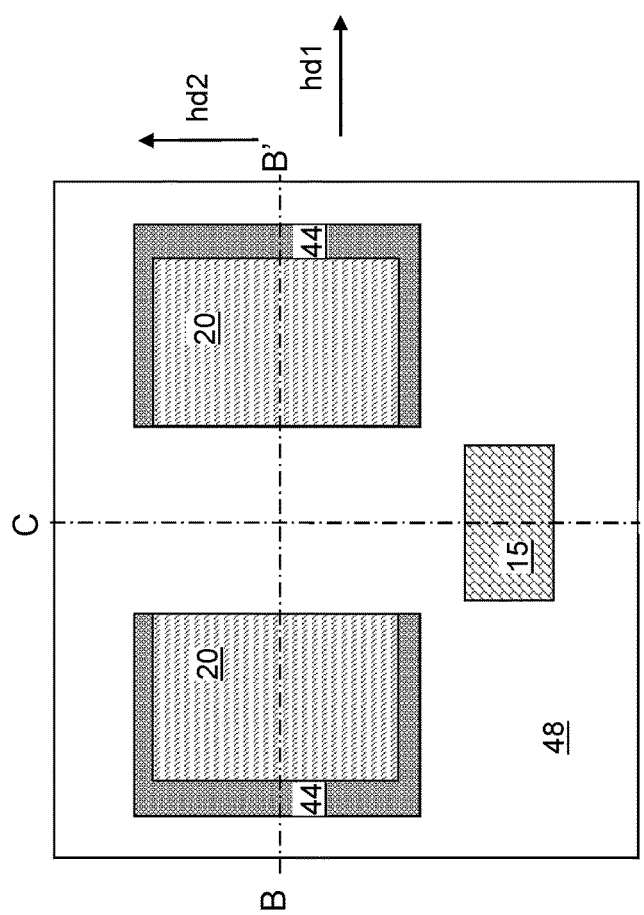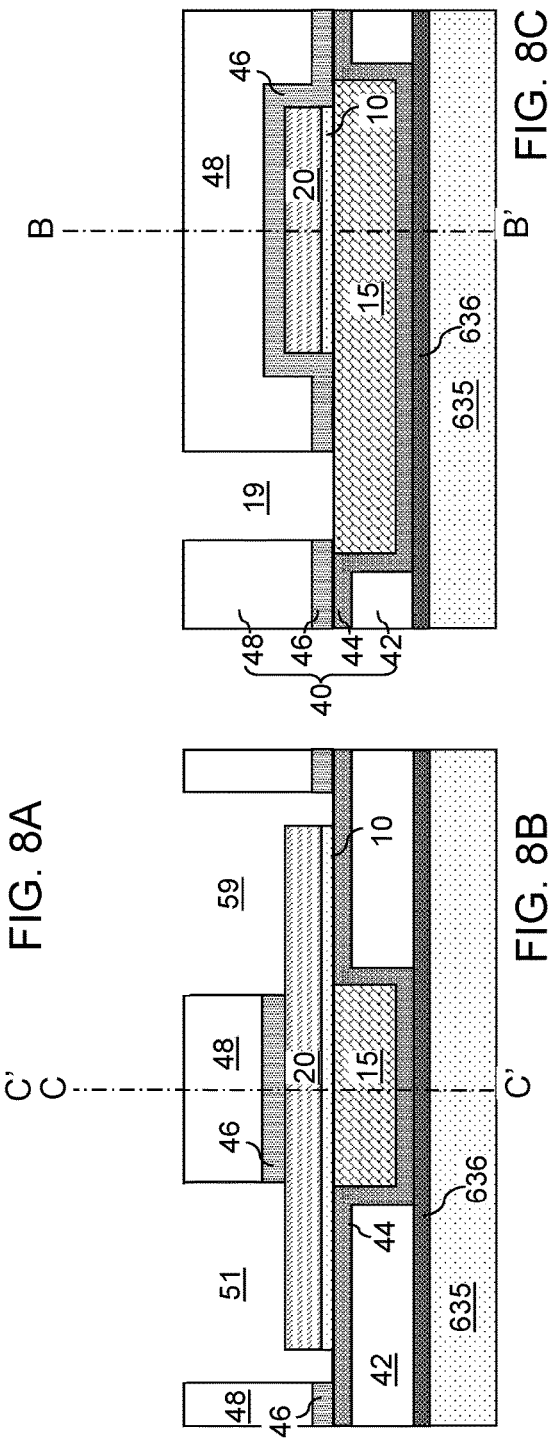

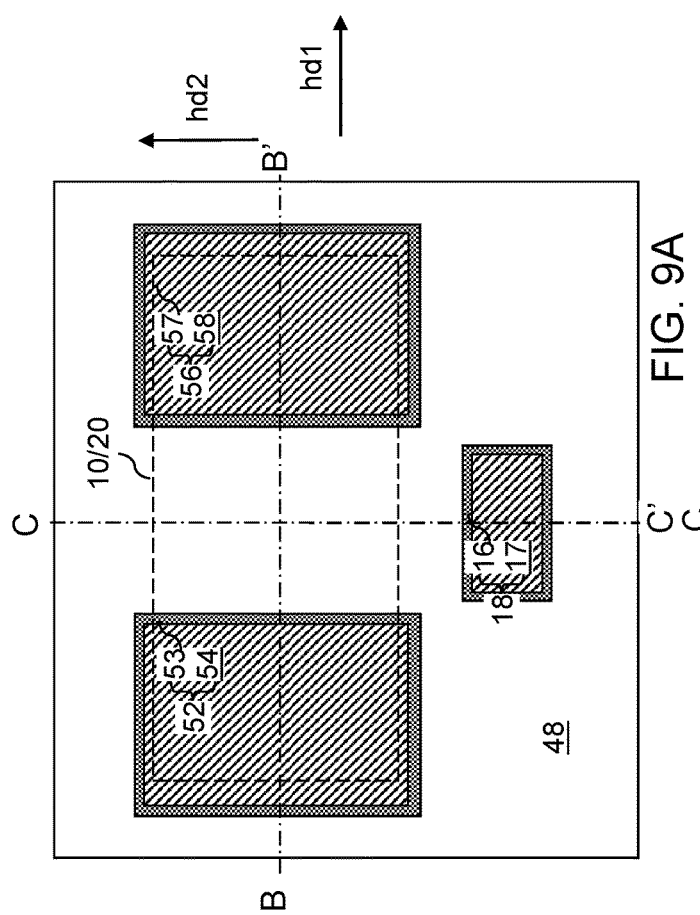
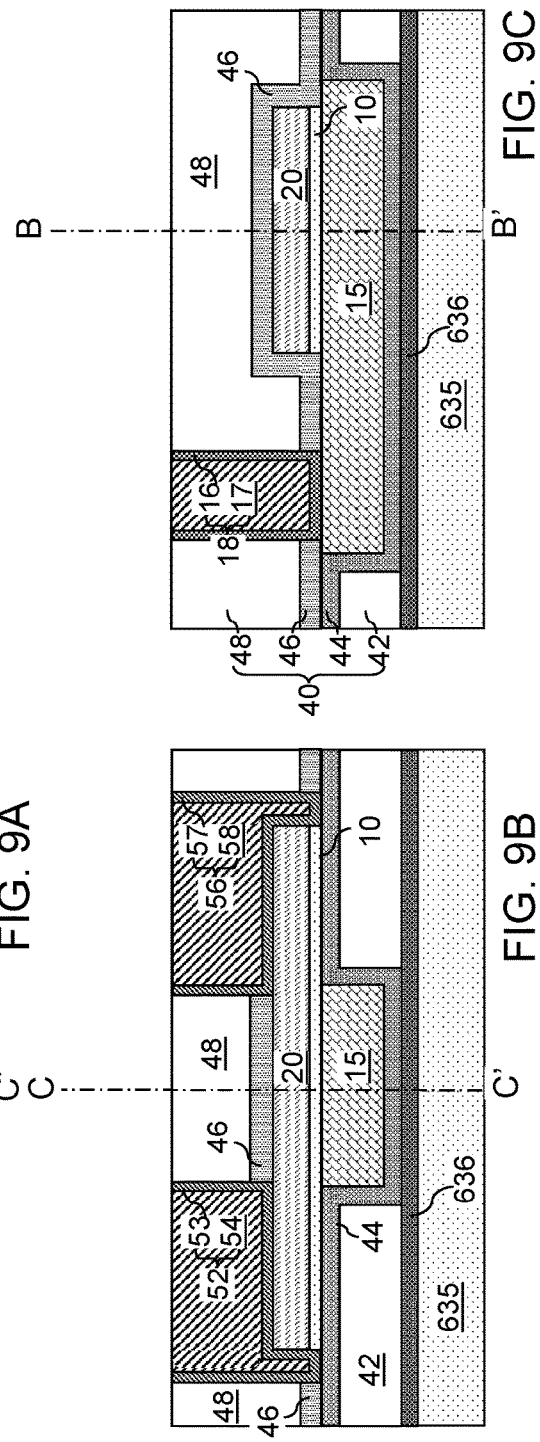

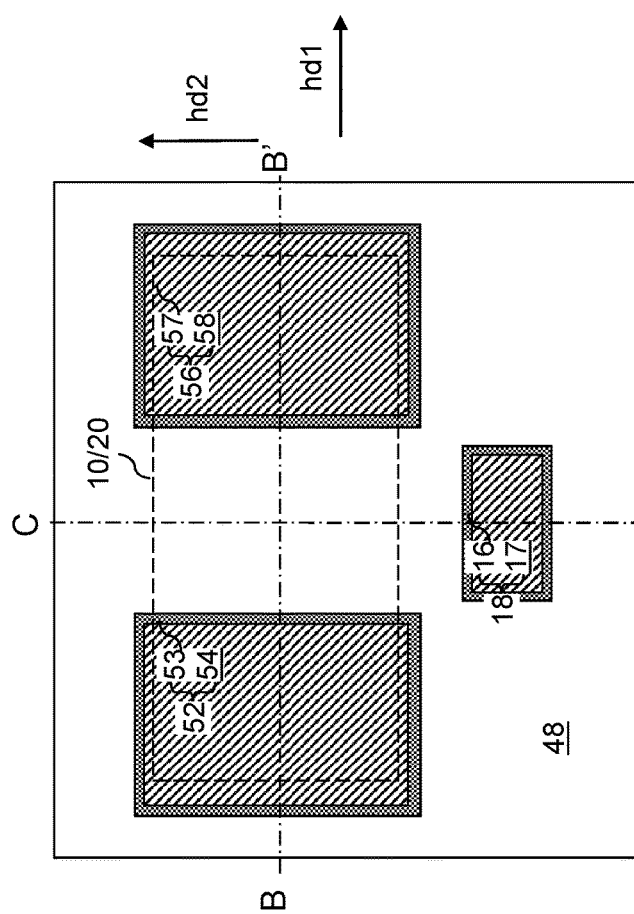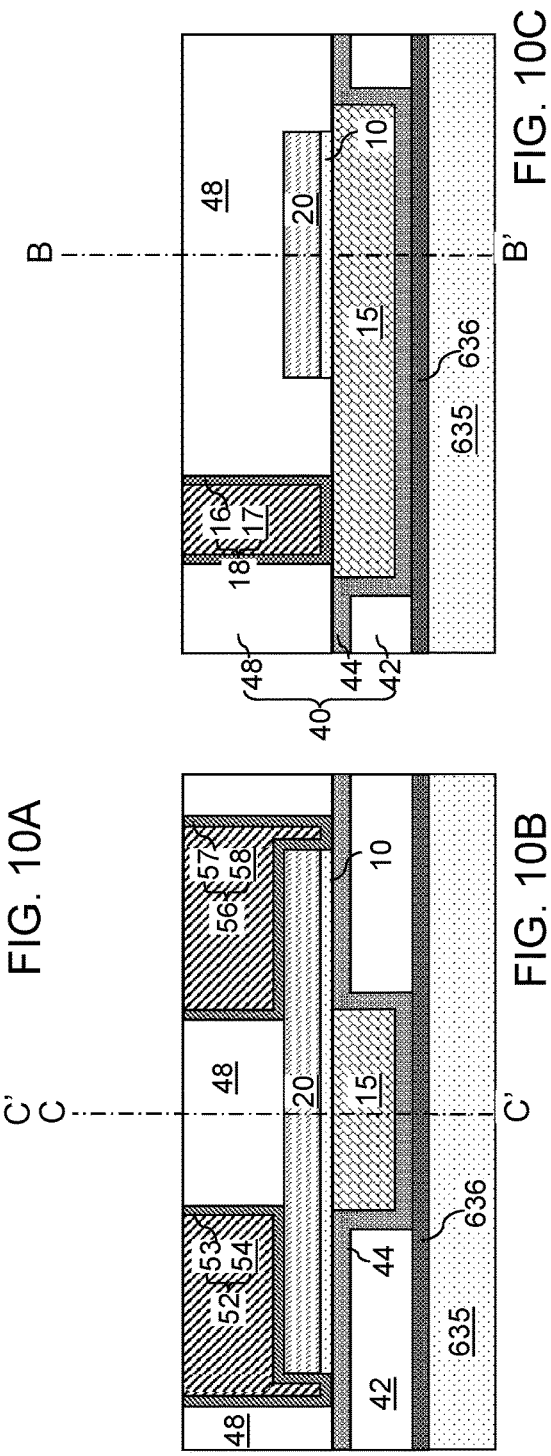

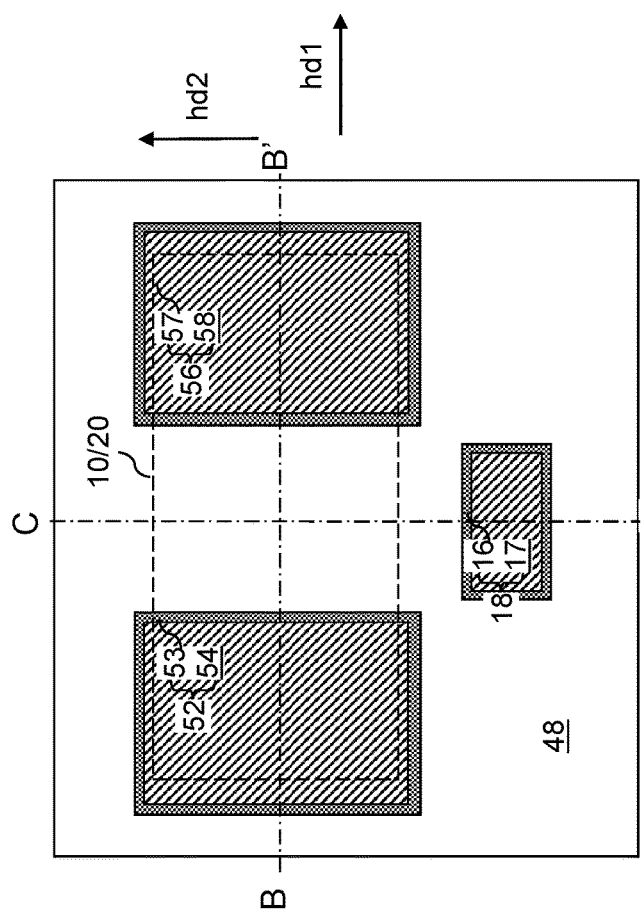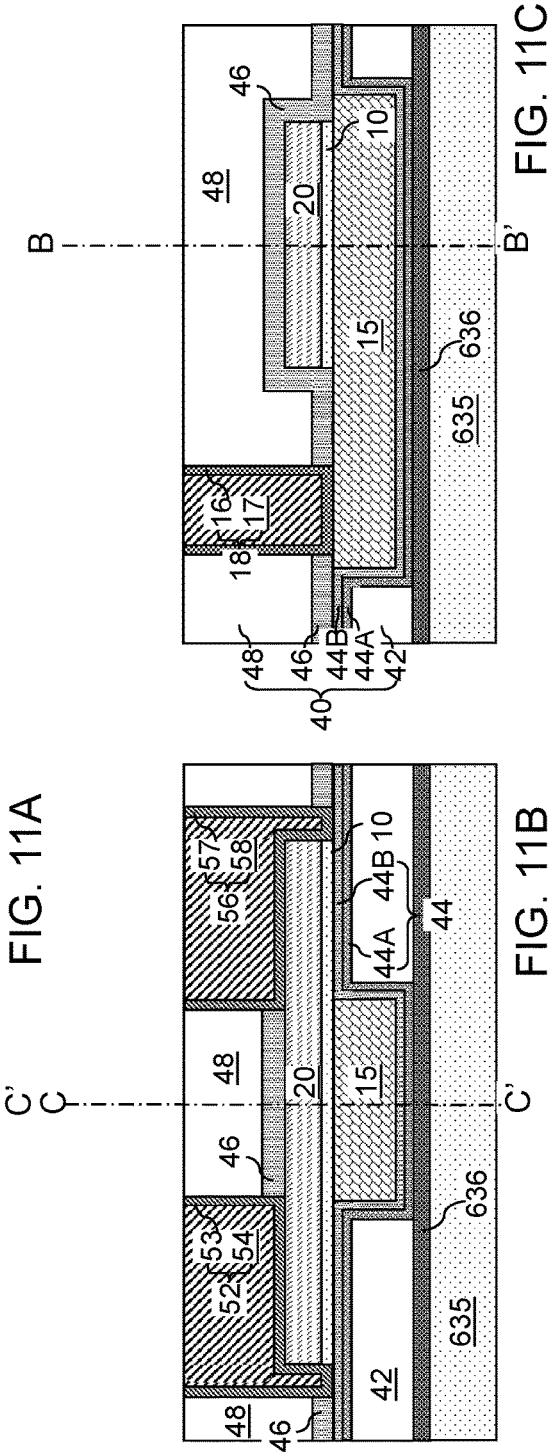

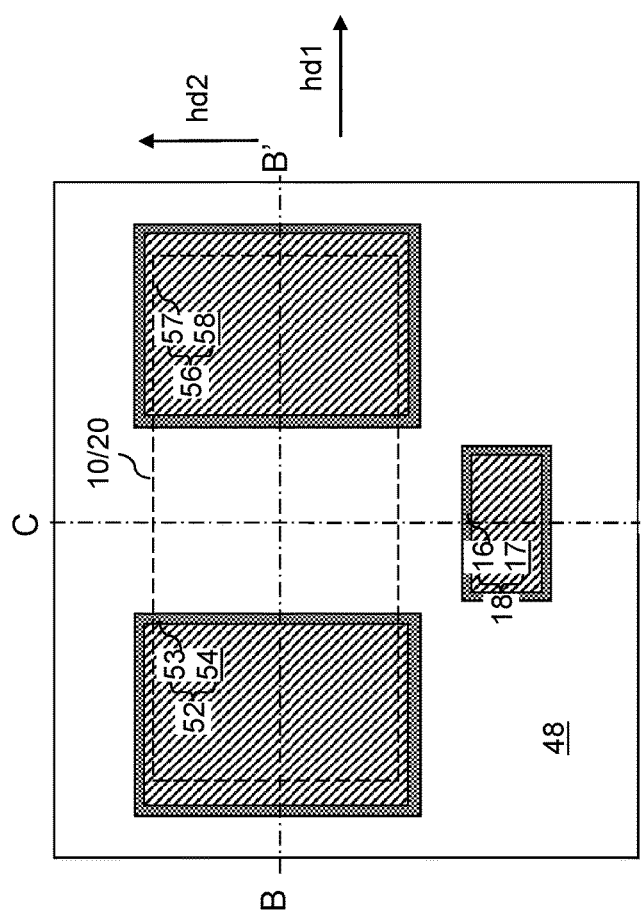
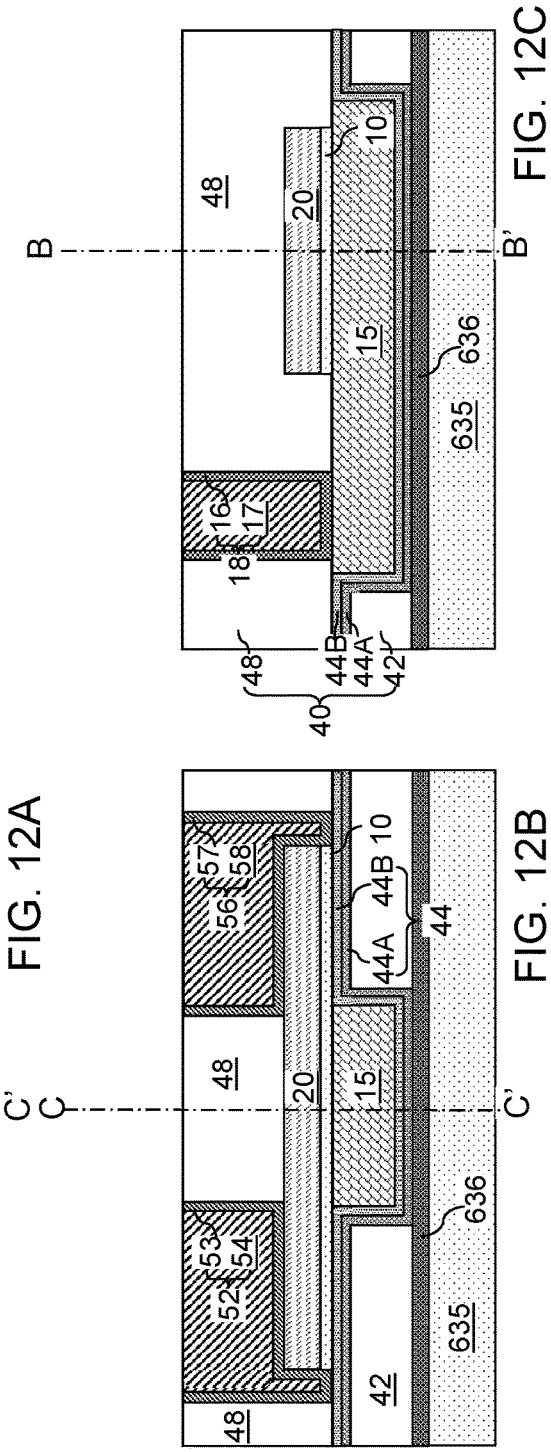
FIG. 12A
FIG. 12B
FIG. 12C

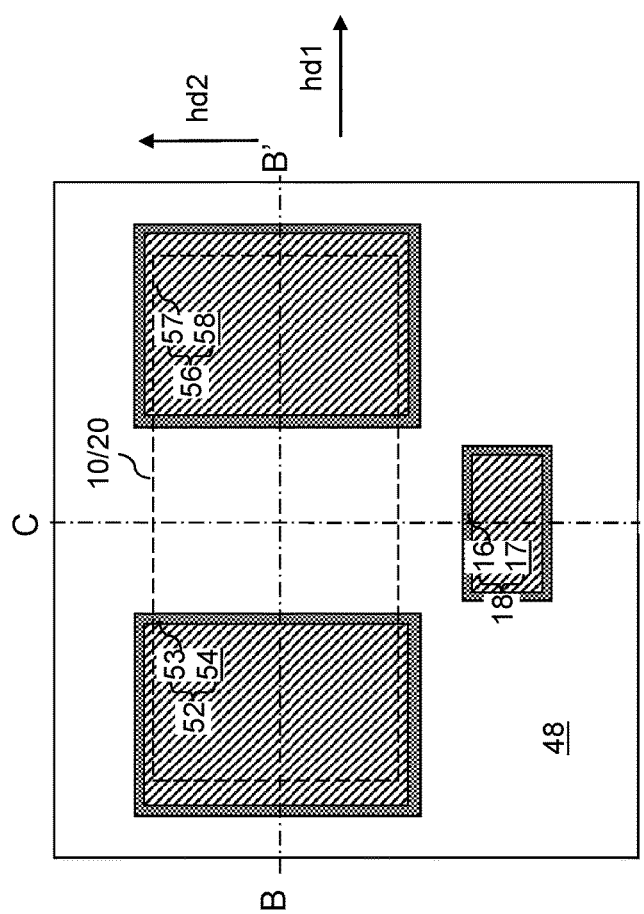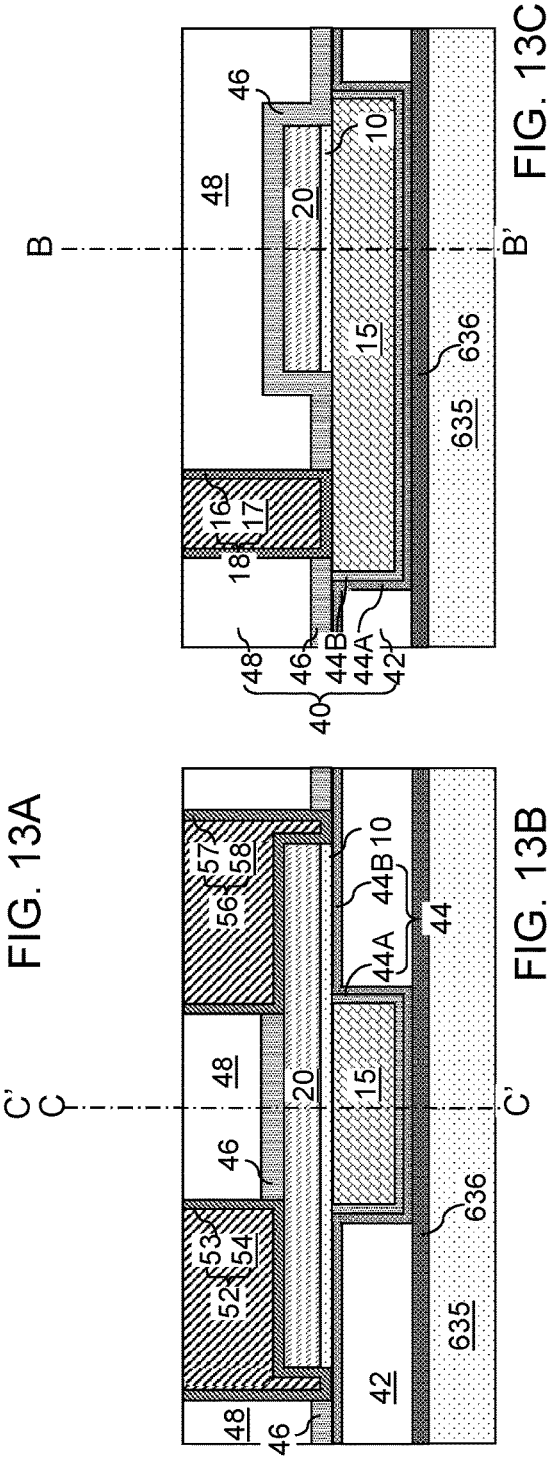

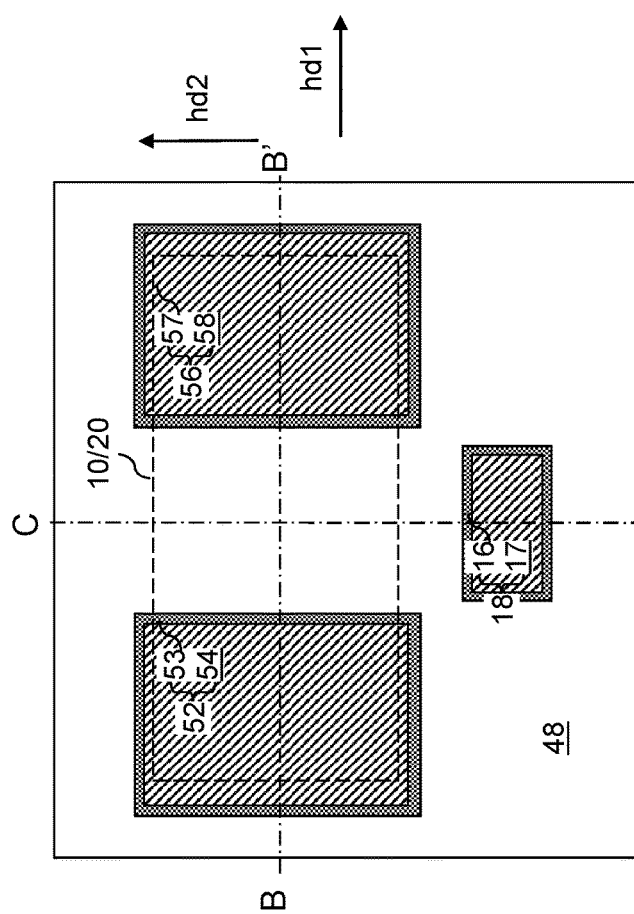
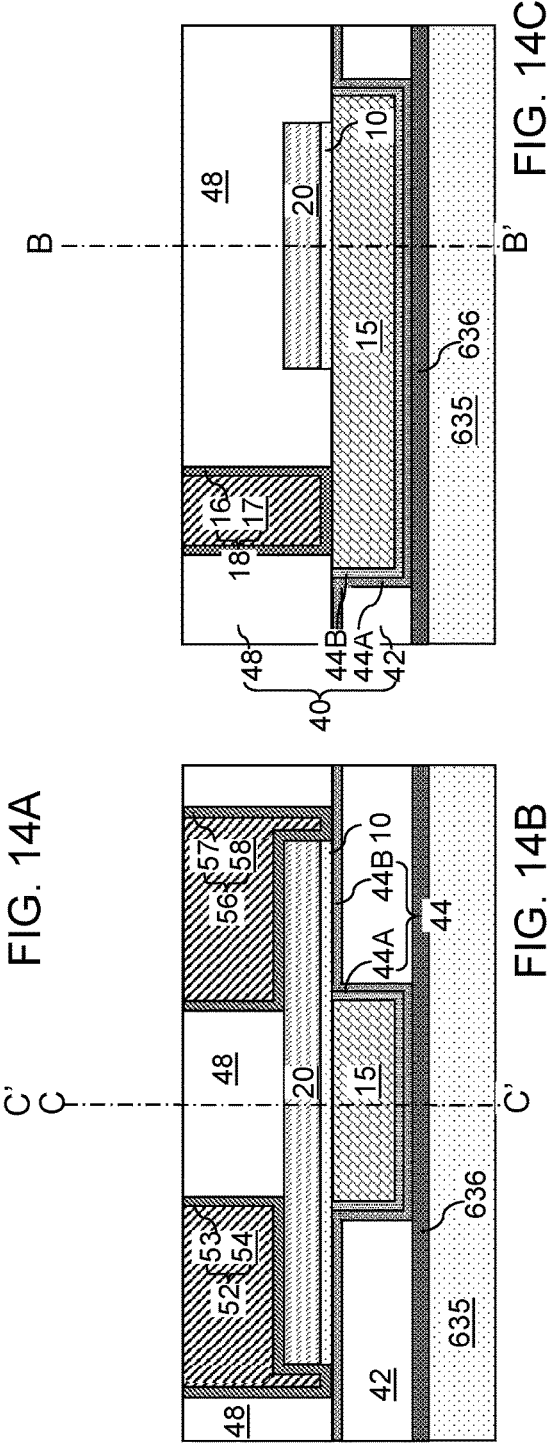
FIG. 14A
FIG. 14B
FIG. 14C

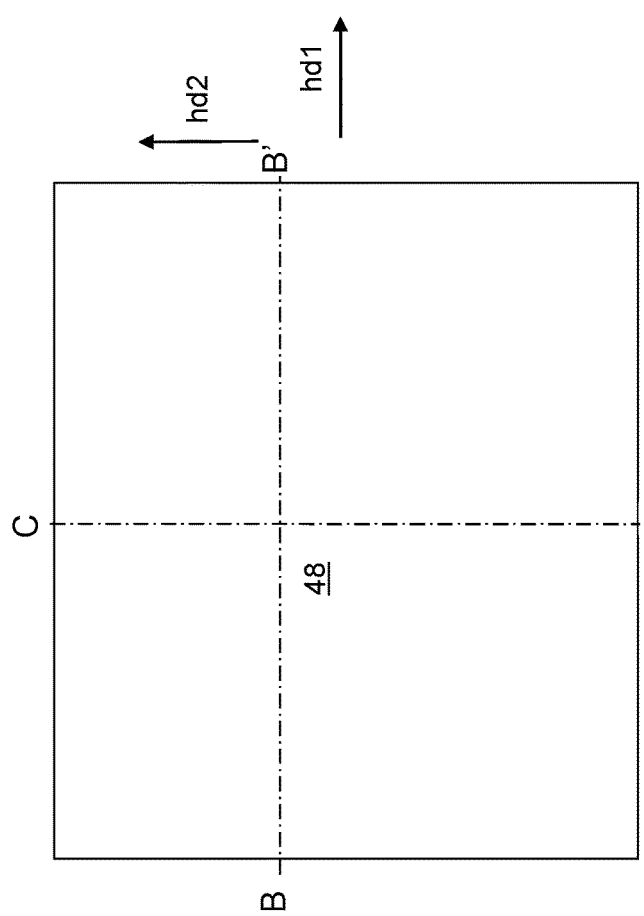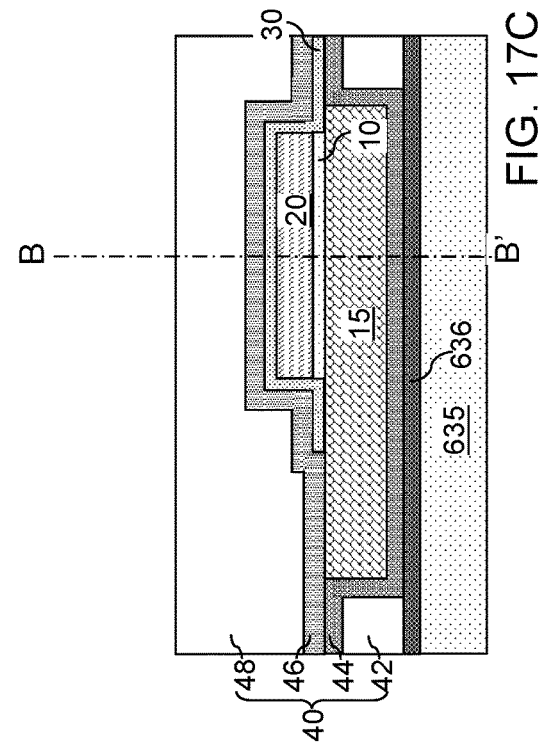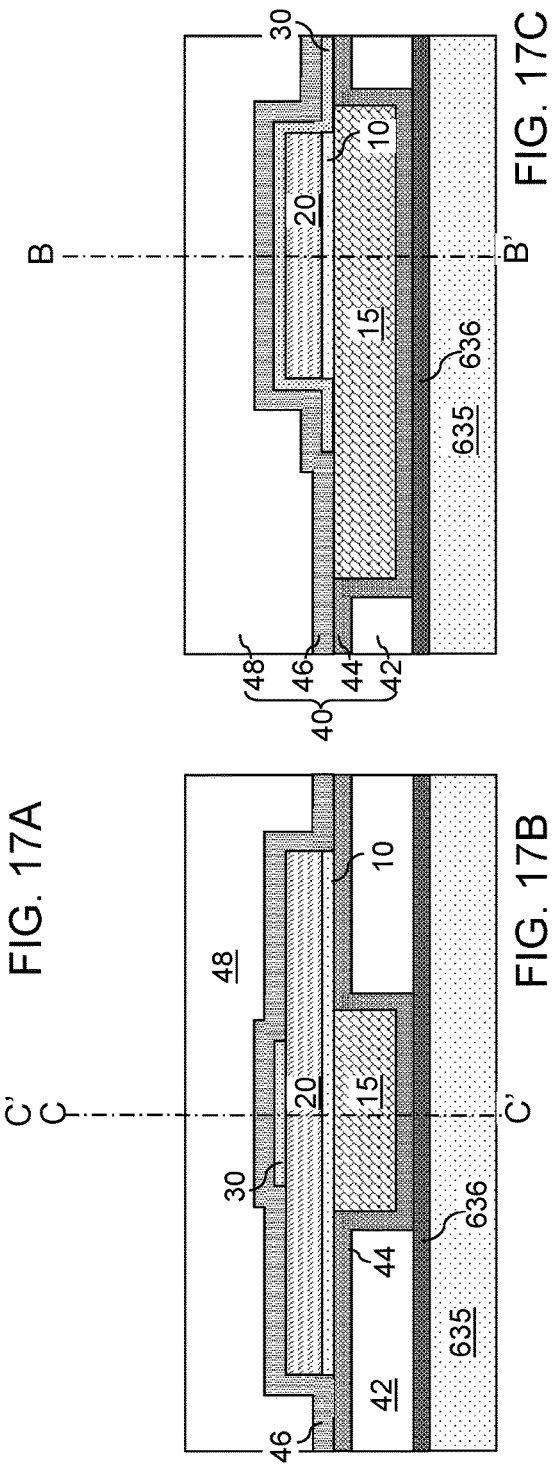

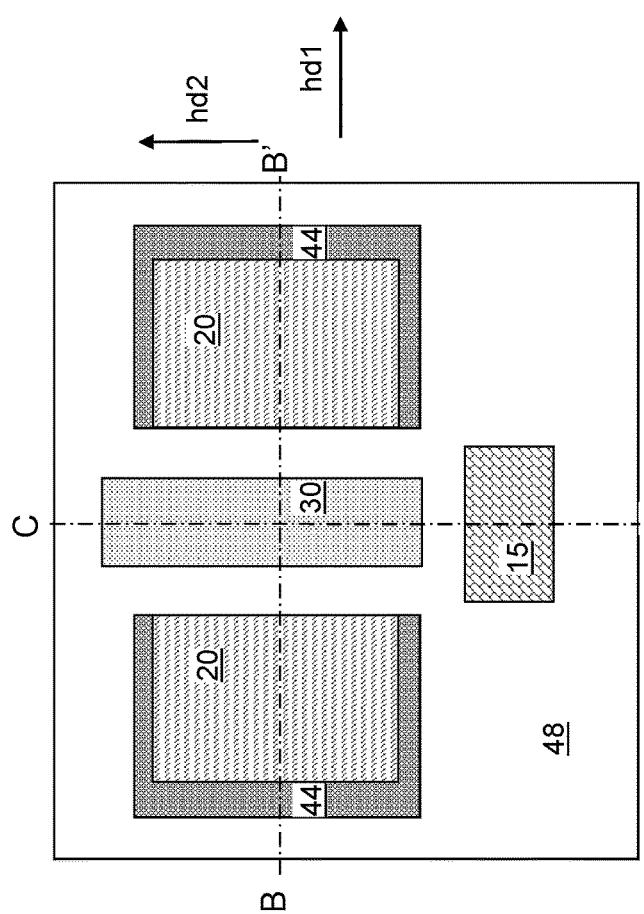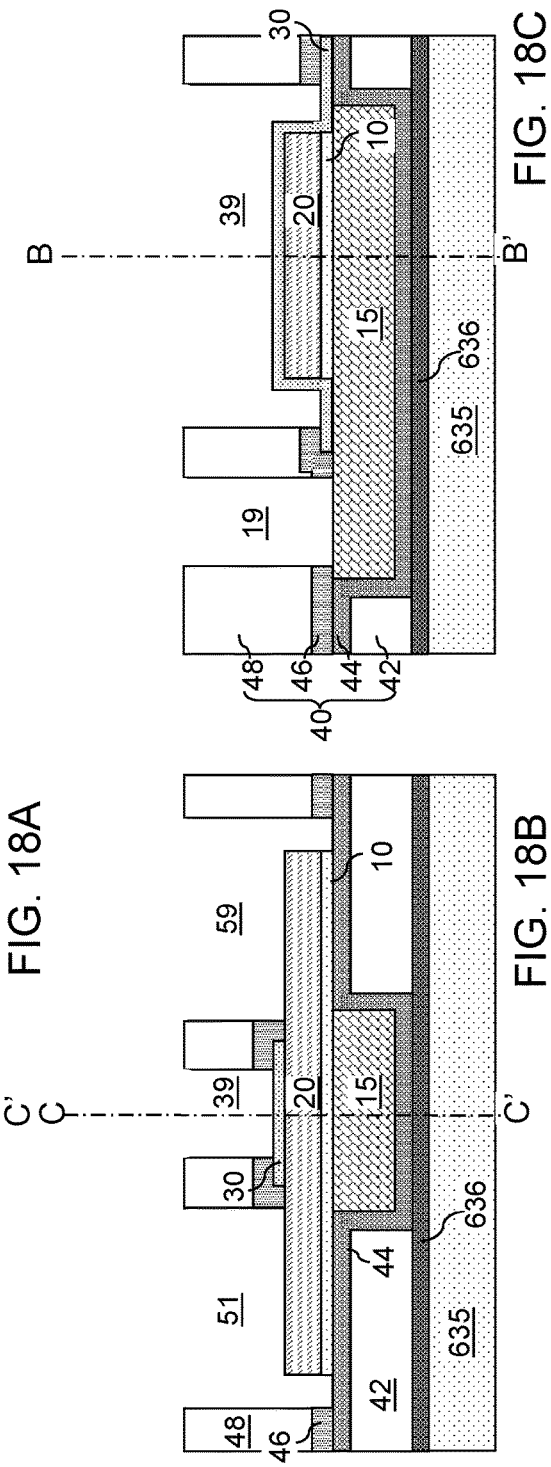

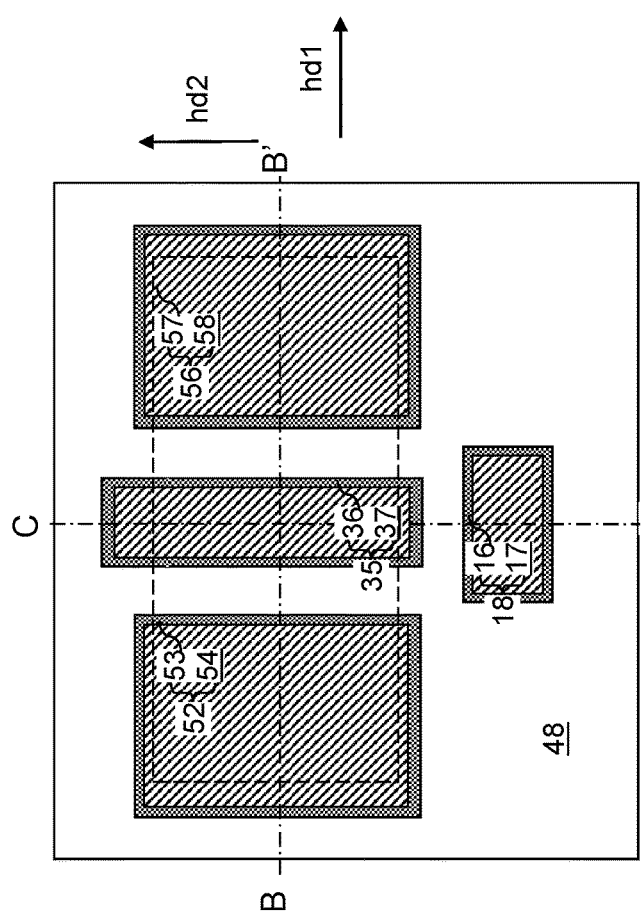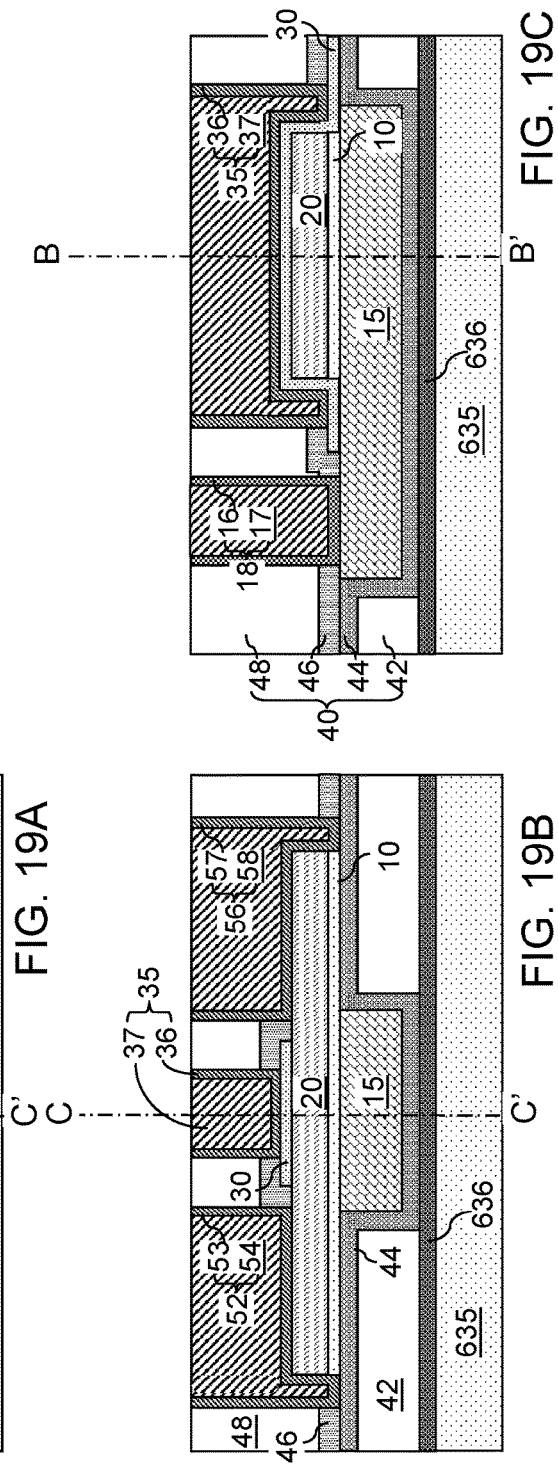

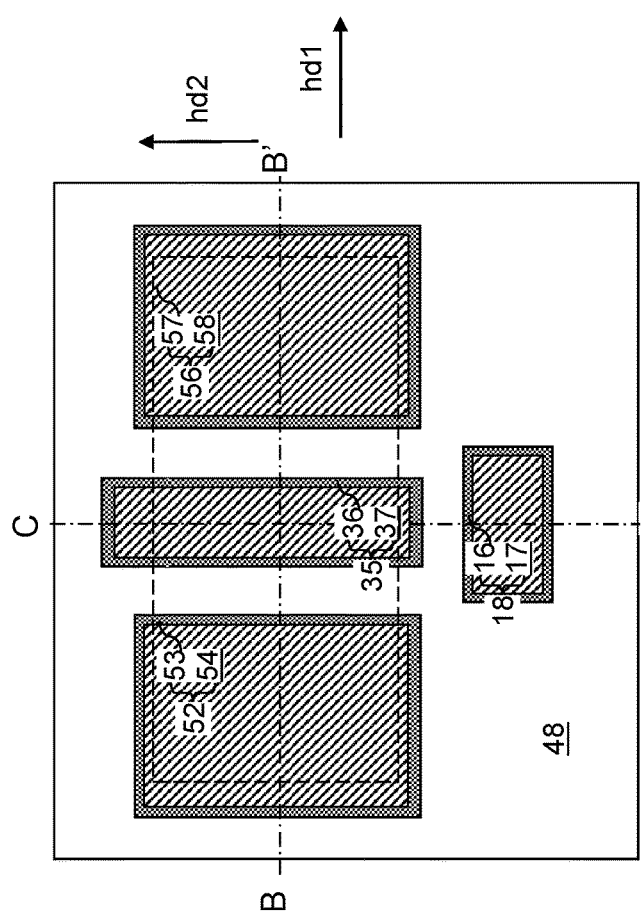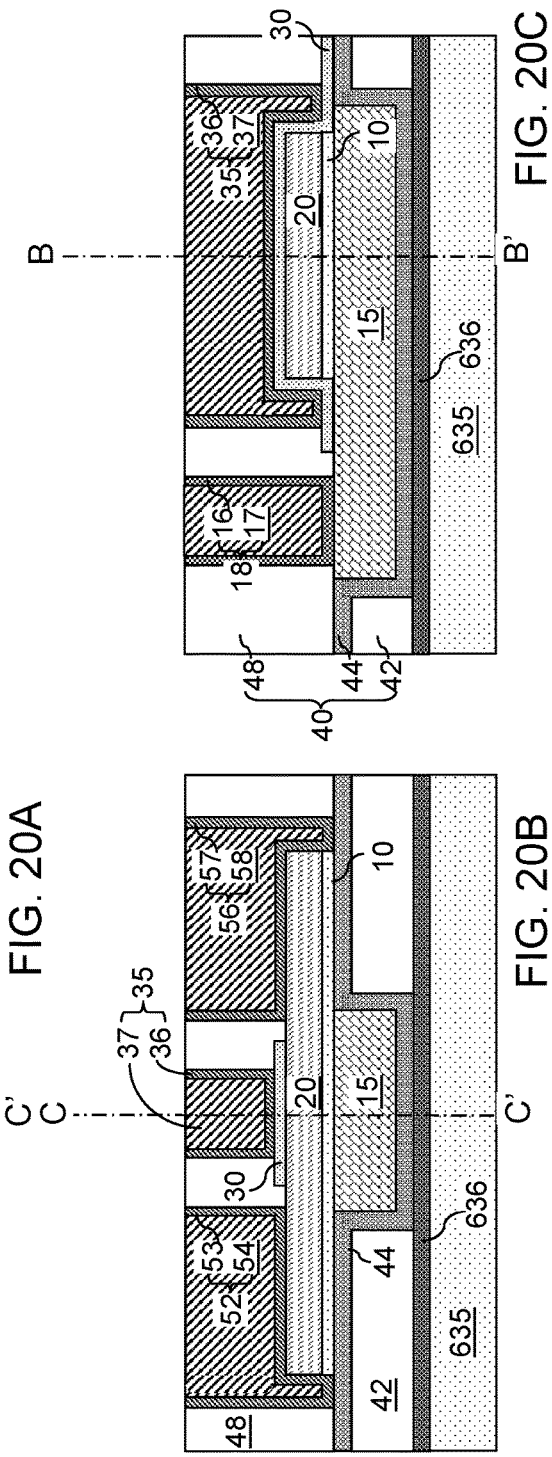

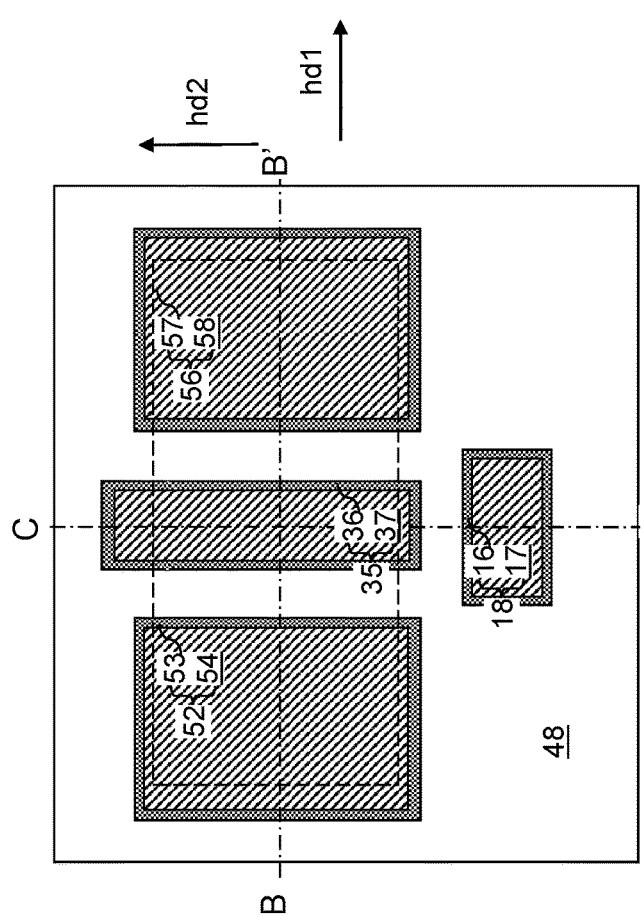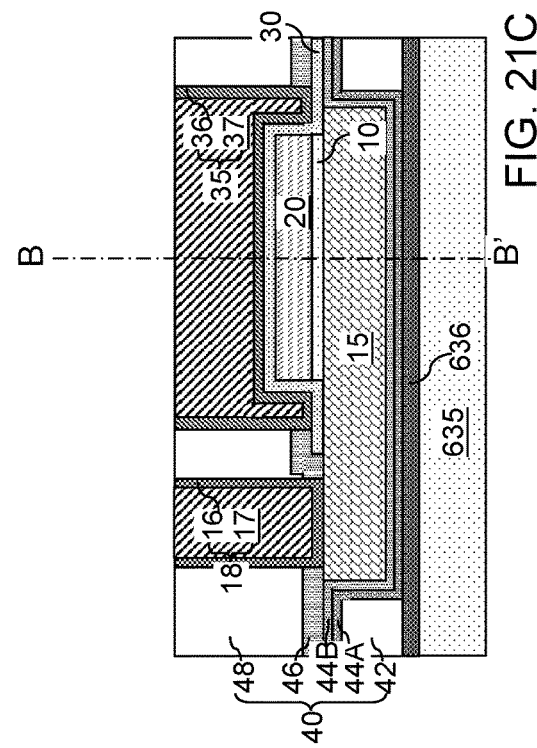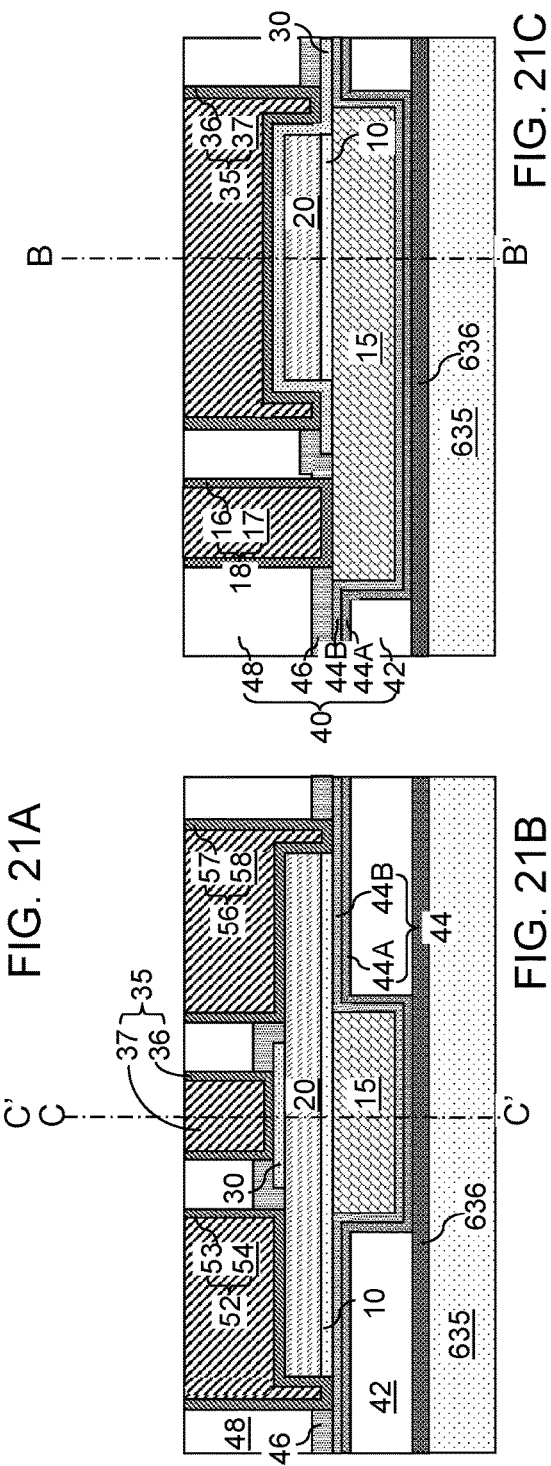
FIG. 21A
FIG. 21B
FIG. 21C

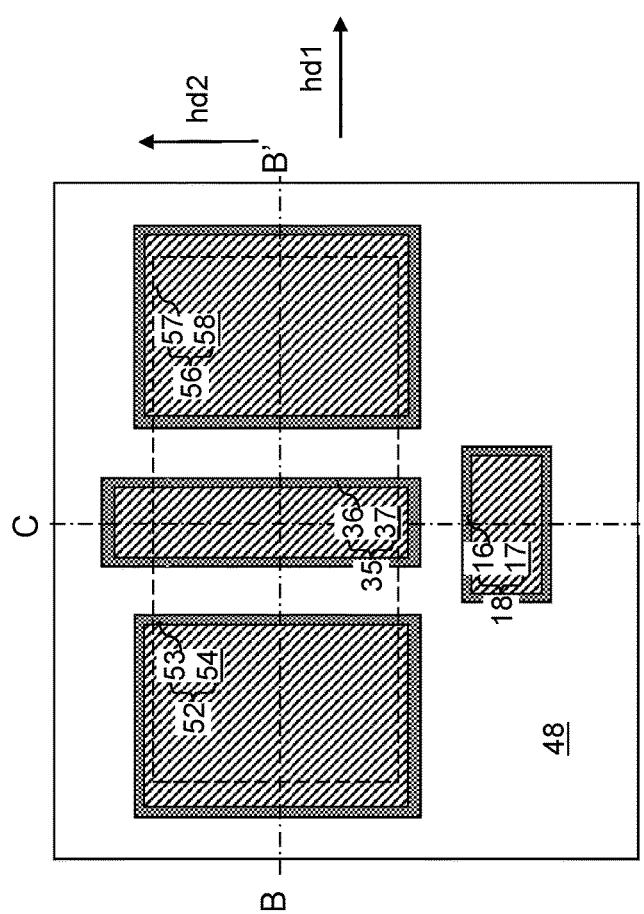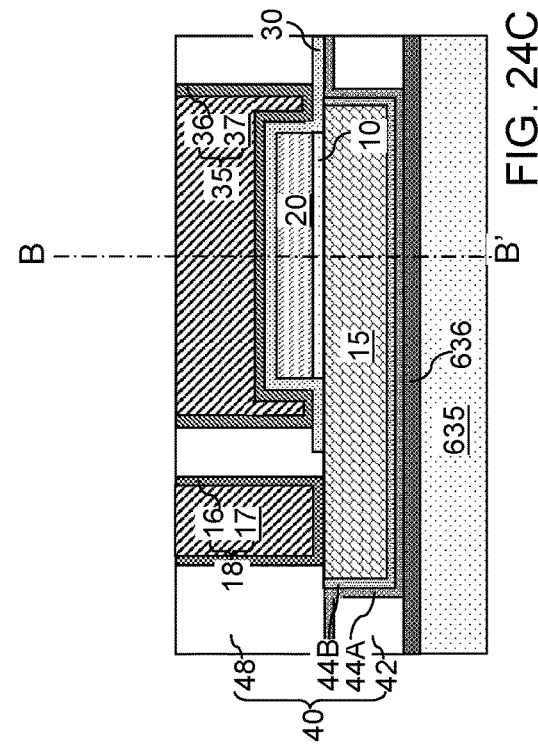

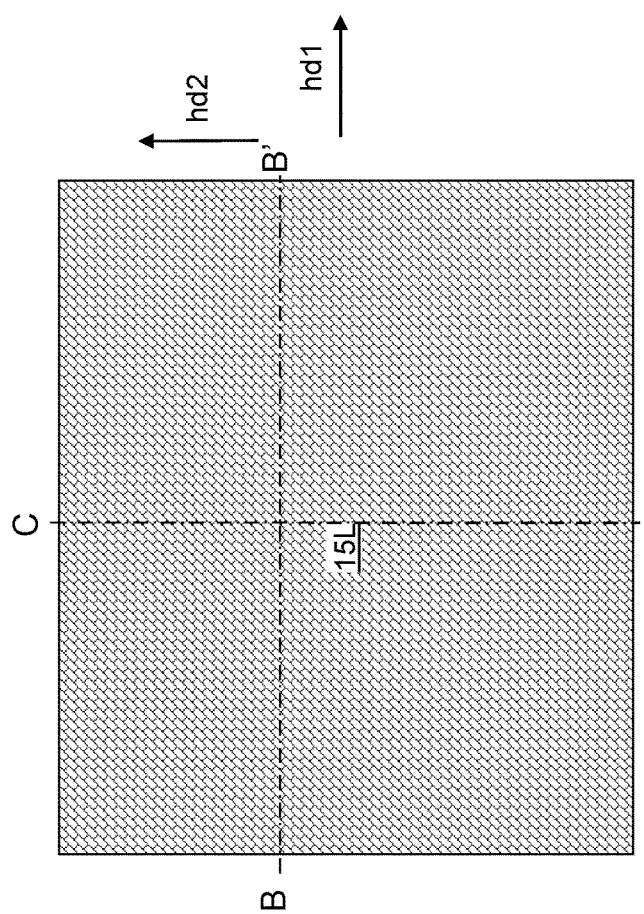

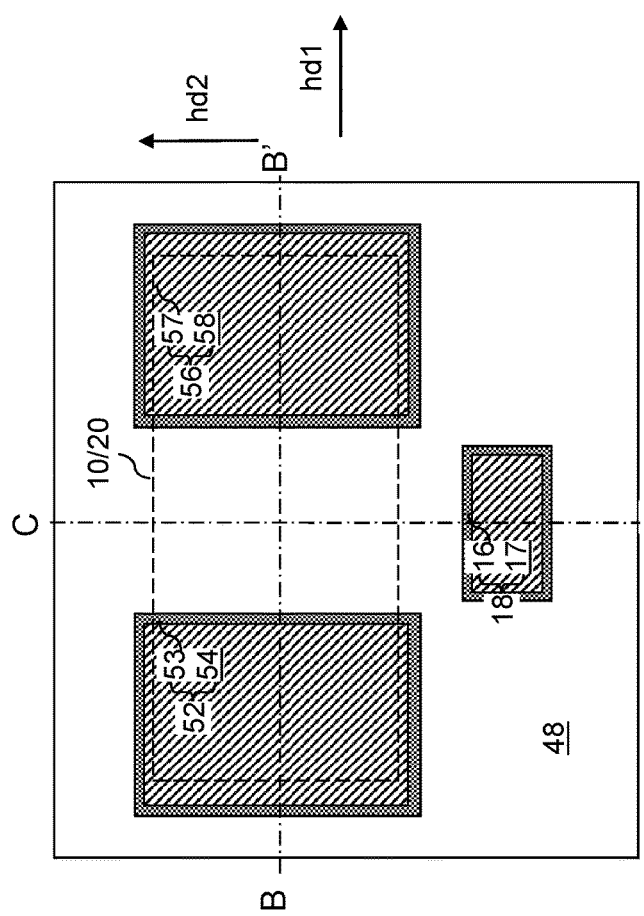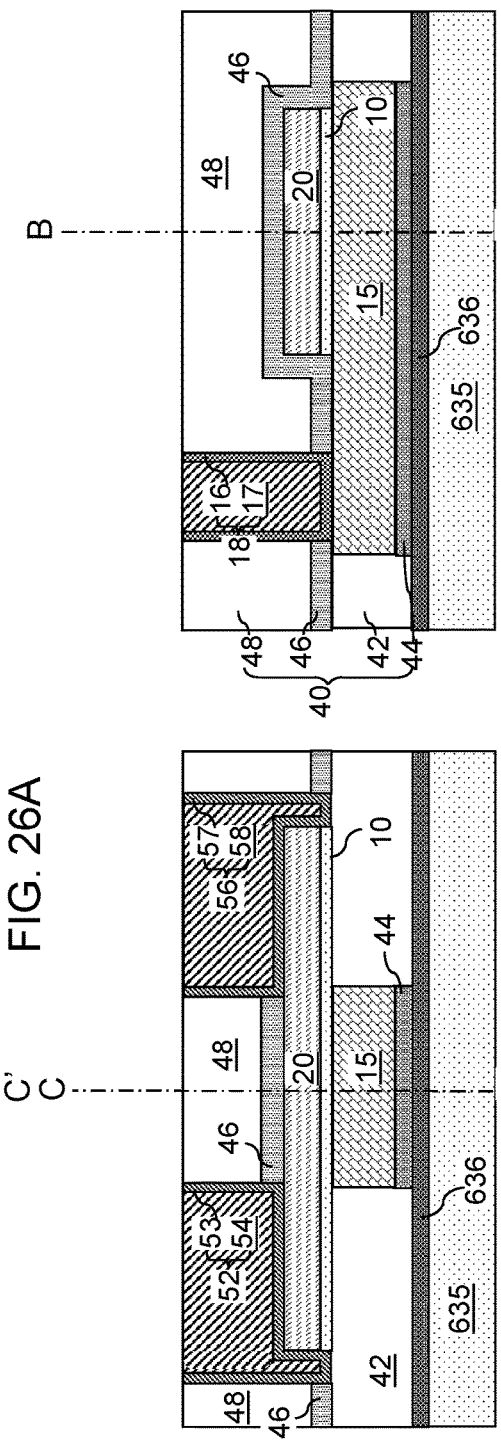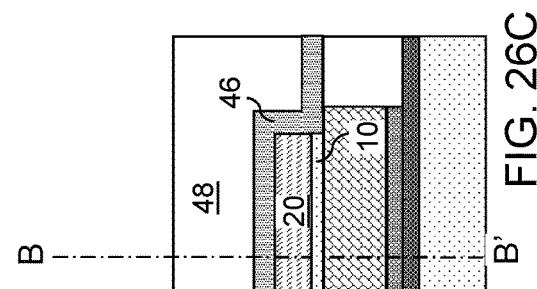

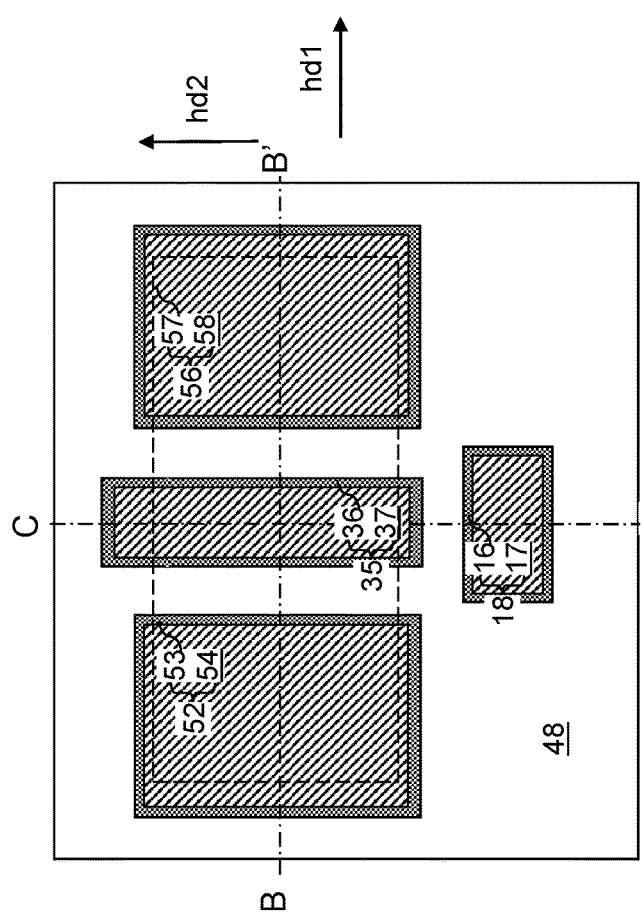
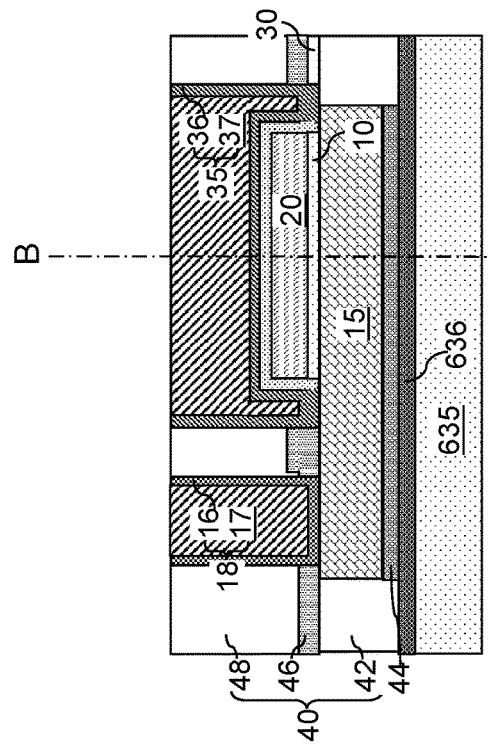
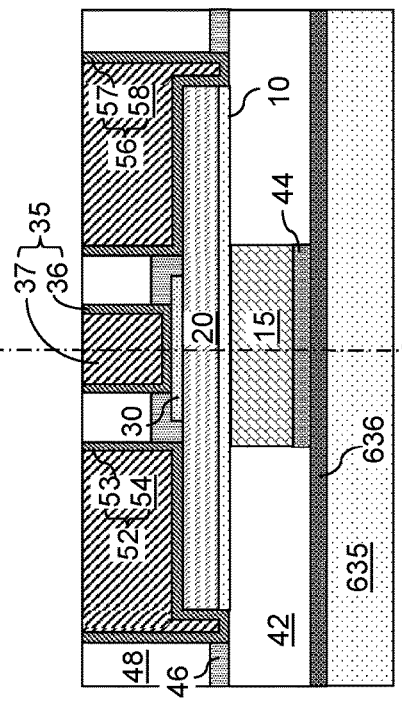
FIG. 27A
FIG. 27B
FIG. 27C

THIN TRANSISTOR INCLUDING A HYDROGEN-BLOCKING DIELECTRIC BARRIER AND METHODS FOR FORMING THE SAME

RELATED APPLICATIONS

This application claims the benefit of priority from a U.S. provisional application Ser. No. 63/144,493, entitled "Thin Film Transistor (TFT) with a Barrier Layer", filed on Feb. 2, 2021, the entire contents of which are incorporated herein by reference.

BACKGROUND

Thin film transistors (TFT) made of oxide semiconductors are an attractive option for back-end-of-line (BEOL) integration since TFTs may be processed at low temperatures and thus, will not damage previously fabricated devices. For example, the fabrication conditions and techniques may not damage previously fabricated front-end-of-line (FEOL) and middle end-of-line (MEOL) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A is a top-down view of a portion of the first exemplary structure after formation of an insulating matrix layer according to a first embodiment of the present disclosure.

FIG. 2B is a vertical cross-sectional view of the first exemplary structure along the vertical plane B-B' of FIG. 2A.

FIG. 2C is a vertical cross-sectional view of the first exemplary structure along the vertical plane C-C' of FIG. 2A.

FIG. 3A is a top-down view of a region of the first exemplary structure after formation of an opening in the insulating matrix layer according to the first embodiment of the present disclosure.

FIG. 3B is a vertical cross-sectional view of the first exemplary structure along the vertical plane B-B' of FIG. 3A.

FIG. 3C is a vertical cross-sectional view of the first exemplary structure along the vertical plane C-C' of FIG. 3A.

FIG. 4A is a top-down view of a region of the first exemplary structure after formation of a hydrogen-blocking dielectric barrier layer according to the first embodiment of the present disclosure.

FIG. 4B is a vertical cross-sectional view of the first exemplary structure along the vertical plane B-B' of FIG. 4A.

FIG. 4C is a vertical cross-sectional view of the first exemplary structure along the vertical plane C-C' of FIG. 4A.

FIG. 5A is a top-down view of a region of the first exemplary structure after formation of a bottom gate electrode according to the first embodiment of the present disclosure.

FIG. 5B is a vertical cross-sectional view of the first exemplary structure along the vertical plane B-B' of FIG. 5A.

FIG. 5C is a vertical cross-sectional view of the first exemplary structure along the vertical plane C-C' of FIG. 5A.

FIG. 7A is a top-down view of a region of the first exemplary structure after formation of a capping hydrogen-blocking dielectric barrier layer and an electrode-level dielectric material layer according to the first embodiment of the present disclosure.

FIG. 7B is a vertical cross-sectional view of the first exemplary structure along the vertical plane B-B' of FIG. 7A.

FIG. 7C is a vertical cross-sectional view of the first exemplary structure along the vertical plane C-C' of FIG. 7A.

FIG. 8A is a top-down view of a region of the first exemplary structure after formation of a source cavity, a drain cavity, and a bottom gate contact via cavity according to the first embodiment of the present disclosure.

FIG. 8B is a vertical cross-sectional view of the first exemplary structure along the vertical plane B-B' of FIG. 8A.

FIG. 8C is a vertical cross-sectional view of the first exemplary structure along the vertical plane C-C' of FIG. 8A.

FIG. 9A is a top-down view of a region of the first exemplary structure after formation of a source electrode, a drain electrode, and a backside electrode contact via structure according to the first embodiment of the present disclosure.

FIG. 9B is a vertical cross-sectional view of the first exemplary structure along the vertical plane B-B' of FIG. 9A.

FIG. 9C is a vertical cross-sectional view of the first exemplary structure along the vertical plane C-C' of FIG. 9A.

FIG. 10A is a top-down view of a region of a first alternative configuration of the first exemplary structure after formation of a source electrode, a drain electrode, and a backside electrode contact via structure according to the first embodiment of the present disclosure.

FIG. 10B is a vertical cross-sectional view of the first exemplary structure along the vertical plane B-B' of FIG. 10A.

FIG. 10C is a vertical cross-sectional view of the first exemplary structure along the vertical plane C-C' of FIG. 10A.

FIG. 11A is a top-down view of a region of a second alternative configuration of the first exemplary structure after formation of a source electrode, a drain electrode, and a backside electrode contact via structure according to the first embodiment of the present disclosure.

FIG. 11B is a vertical cross-sectional view of the first exemplary structure along the vertical plane B-B' of FIG. 11A.

FIG. 11C is a vertical cross-sectional view of the first exemplary structure along the vertical plane C-C' of FIG. 11A.

FIG. 12A is a top-down view of a region of a third alternative configuration of the first exemplary structure after formation of a source electrode, a drain electrode, and a backside electrode contact via structure according to the first embodiment of the present disclosure.

FIG. 12B is a vertical cross-sectional view of the first exemplary structure along the vertical plane B-B' of FIG. 12A.

FIG. 12C is a vertical cross-sectional view of the first exemplary structure along the vertical plane C-C' of FIG. 12A.

FIG. 13A is a top-down view of a region of a fourth alternative configuration of the first exemplary structure after formation of a source electrode, a drain electrode, and a backside electrode contact via structure according to the first embodiment of the present disclosure.

FIG. 13B is a vertical cross-sectional view of the first exemplary structure along the vertical plane B-B' of FIG. 13A.

FIG. 13C is a vertical cross-sectional view of the first exemplary structure along the vertical plane C-C' of FIG. 13A.

FIG. 14A is a top-down view of a region of a fifth alternative configuration of the first exemplary structure after formation of a source electrode, a drain electrode, and a backside electrode contact via structure according to the first embodiment of the present disclosure.

FIG. 14B is a vertical cross-sectional view of the first exemplary structure along the vertical plane B-B' of FIG. 14A.

FIG. 14C is a vertical cross-sectional view of the first exemplary structure along the vertical plane C-C' of FIG. 14A.

FIG. 17A is a top-down view of a region of the second exemplary structure after formation of a capping hydrogen-blocking dielectric barrier layer and an electrode-level dielectric material layer according to the second embodiment of the present disclosure.

FIG. 17B is a vertical cross-sectional view of the second exemplary structure along the vertical plane B-B' of FIG. 17A.

FIG. 17C is a vertical cross-sectional view of the second exemplary structure along the vertical plane C-C' of FIG. 17A.

FIG. 18A is a top-down view of a region of the second exemplary structure after formation of a source cavity, a drain cavity, a gate cavity, and a bottom gate contact via cavity according to the second embodiment of the present disclosure.

FIG. 18B is a vertical cross-sectional view of the second exemplary structure along the vertical plane B-B' of FIG. 18A.

FIG. 18C is a vertical cross-sectional view of the second exemplary structure along the vertical plane C-C' of FIG. 18A.

FIG. 19A is a top-down view of a region of the second exemplary structure after formation of a source electrode, a drain electrode, and a backside electrode contact via structure according to the second embodiment of the present disclosure.

FIG. 19B is a vertical cross-sectional view of the second exemplary structure along the vertical plane B-B' of FIG. 19A.

FIG. 19C is a vertical cross-sectional view of the second exemplary structure along the vertical plane C-C' of FIG. 19A.

FIG. 20A is a top-down view of a region of a first alternative configuration of the second exemplary structure after formation of a source electrode, a drain electrode, and a backside electrode contact via structure according to the second embodiment of the present disclosure.

FIG. 20B is a vertical cross-sectional view of the second exemplary structure along the vertical plane B-B' of FIG. 20A.

FIG. 20C is a vertical cross-sectional view of the second exemplary structure along the vertical plane C-C' of FIG. 20A.

FIG. 21A is a top-down view of a region of a second alternative configuration of the second exemplary structure after formation of a source electrode, a drain electrode, and a backside electrode contact via structure according to the second embodiment of the present disclosure.

FIG. 21B is a vertical cross-sectional view of the second exemplary structure along the vertical plane B-B' of FIG. 21A.

FIG. 21C is a vertical cross-sectional view of the second exemplary structure along the vertical plane C-C' of FIG. 21A.

FIG. 24A is a top-down view of a region of a fifth alternative configuration of the second exemplary structure after formation of a source electrode, a drain electrode, and a backside electrode contact via structure according to the second embodiment of the present disclosure.

FIG. 24B is a vertical cross-sectional view of the second exemplary structure along the vertical plane B-B' of FIG. 24A.

FIG. 24C is a vertical cross-sectional view of the second exemplary structure along the vertical plane C-C' of FIG. 24A.

FIG. 25A is a top-down view of a region of a third exemplary structure after formation of a hydrogen-blocking dielectric barrier layer and a gate electrode layer according to a third embodiment of the present disclosure.

FIG. 25B is a vertical cross-sectional view of the third exemplary structure along the vertical plane B-B' of FIG. 25A.

FIG. 25C is a vertical cross-sectional view of the third exemplary structure along the vertical plane C-C' of FIG. 25A.

FIG. 26A is a top-down view of a region of a third exemplary structure after formation of a source electrode, a drain electrode, and a backside electrode contact via structure according to the third embodiment of the present disclosure.

FIG. 26B is a vertical cross-sectional view of the third exemplary structure along the vertical plane B-B' of FIG. 26A.

FIG. 26C is a vertical cross-sectional view of the third exemplary structure along the vertical plane C-C' of FIG. 26A.

FIG. 27A is a top-down view of a region of an alternative configuration of the third exemplary structure after formation of a source electrode, a drain electrode, and a backside electrode contact via structure according to the third embodiment of the present disclosure.

FIG. 27B is a vertical cross-sectional view of the third exemplary structure along the vertical plane B-B' of FIG. 27A.

FIG. 27C is a vertical cross-sectional view of the third exemplary structure along the vertical plane C-C' of FIG. 27A.

DETAILED DESCRIPTION

Figure 1:
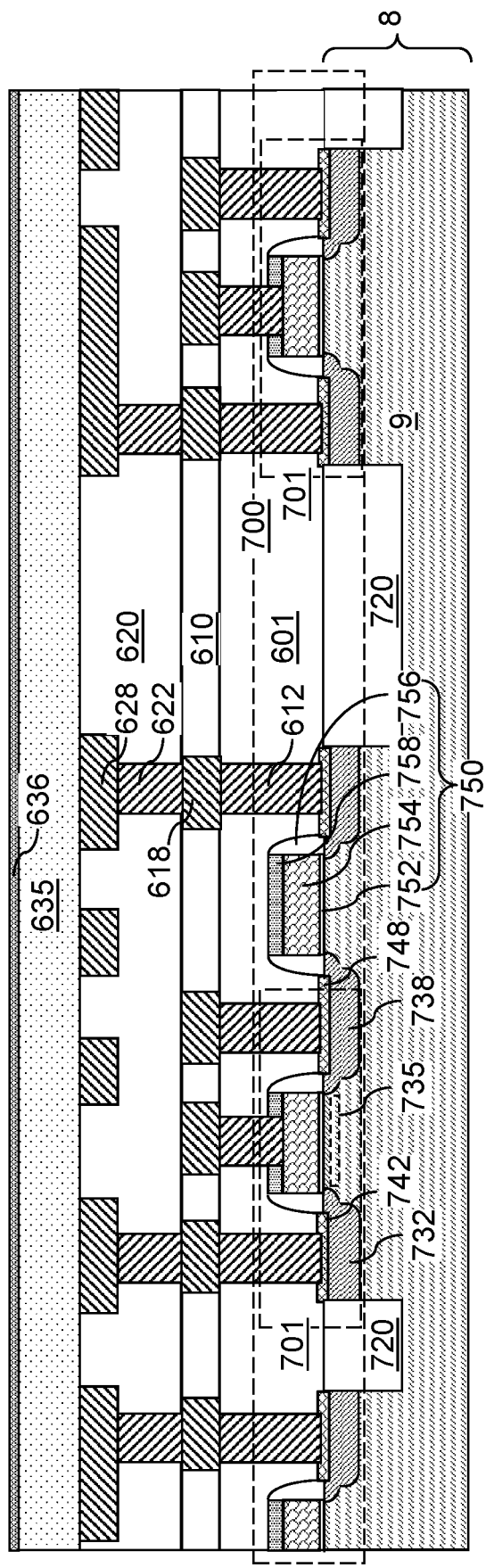
FIG. 1 is a vertical cross-sectional view of a first exemplary structure after formation of complementary metal-oxide-semiconductor (CMOS) transistors, first metal interconnect structures formed in lower-level dielectric material layers, a planar insulating spacer layer, and an optional etch stop dielectric layer according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Elements with the same reference numerals refer to the same element, and are presumed to have the same material composition and the same thickness range unless expressly indicated otherwise.

Generally, the structures and methods of the present disclosure may be used to form a semiconductor structure including at least one thin film transistor such as a plurality of thin film transistors. The thin film transistors may be formed over any substrate, which may be an insulating substrate, a conductive substrate, or a semiconducting substrate. In embodiments that utilize a conductive substrate or a semiconductor substrate, at least one insulating layer may be used to provide electrical isolation between the thin film transistors and the underlying substrate. In embodiments in which a semiconductor substrate such as a single crystalline silicon substrate is used, field effect transistors using portions of the semiconductor substrate as semiconductor channels may be formed on the semiconductor substrate, and metal interconnect structures embedded in interconnect-level dielectric layers may be formed over the field effect transistors. The thin film transistors may be formed over the field effect transistors including single crystalline semiconductor channels and over the metal interconnect structures, which are herein referred to as lower-level metal interconnect structures.

According to an aspect of the present disclosure, a hydrogen-blocking dielectric barrier layer may be formed on the bottom side of each semiconducting metal oxide plate, which includes a polycrystalline semiconductor channel of a respective thin film transistor. Specifically, the hydrogen-blocking dielectric barrier layer may be formed on sidewalls of each opening for forming a bottom gate electrode. The hydrogen-blocking dielectric barrier layer may also be formed over a top surfaces of an insulating matrix layer in which the openings are formed. Optionally, a capping hydrogen-blocking dielectric barrier layer may be formed over the semiconducting metal oxide plates. The hydrogen-blocking dielectric barrier layer and the optional capping hydrogen-blocking dielectric barrier layer prevents diffusion of hydrogen into the semiconducting metal oxide plates or into the bottom gate electrode, and thus, prevents changes in the surface electronic states within the semiconducting metal oxide plates and shifts in the transistor characteristics of the thin film transistors. The various aspects of embodiments of the present disclosure are described now in detail.

Referring to FIG. 1, a first exemplary structure according to a first embodiment of the present disclosure is illustrated.

The first exemplary structure includes a substrate 8, which may be a semiconductor substrate such as a commercially available silicon substrate. The substrate 8 may include a semiconductor material layer 9 at least at an upper portion thereof. The semiconductor material layer 9 may be a surface portion of a bulk semiconductor substrate, or may be a top semiconductor layer of a semiconductor-on-insulator (SOI) substrate. In one embodiment, the semiconductor material layer 9 includes a single crystalline semiconductor material such as single crystalline silicon. In one embodiment, the substrate 8 may include a single crystalline silicon substrate including a single crystalline silicon material.

Shallow trench isolation structures 720 including a dielectric material such as silicon oxide may be formed in an upper portion of the semiconductor material layer 9. Suitable doped semiconductor wells, such as p-type wells and n-type wells, may be formed within each area that is laterally enclosed by a portion of the shallow trench isolation structures 720. Field effect transistors 701 may be formed over the top surface of the semiconductor material layer 9. For example, each field effect transistor 701 may include a source electrode 732, a drain electrode 738, a semiconductor channel 735 that includes a surface portion of the substrate 8 extending between the source electrode 732 and the drain electrode 738, and a gate structure 750. The semiconductor channel 735 may include a single crystalline semiconductor material. Each gate structure 750 may include a gate dielectric layer 752, a gate electrode 754, a gate cap dielectric 758, and a dielectric gate spacer 756. A source-side metal-semiconductor alloy region 742 may be formed on each source electrode 732, and a drain-side metal-semiconductor alloy region 748 may be formed on each drain electrode 738.

In an embodiment in which an array of memory cells may be subsequently formed at a level of a dielectric material layer, the field effect transistors 701 may include a circuit that provides functions that operate the array of memory cells. Specifically, devices in the peripheral region may be configured to control the programming operation, the erase operation, and the sensing (read) operation of the array of memory cells. For example, the devices in the peripheral region may include a sensing circuitry and/or a programming circuitry. The devices formed on the top surface of the semiconductor material layer 9 may include complementary metal-oxide-semiconductor (CMOS) transistors and optionally additional semiconductor devices (such as resistors, diodes, capacitors, etc.), and are collectively referred to as CMOS circuitry 700.

One or more of the field effect transistors 701 in the CMOS circuitry 700 may include a semiconductor channel 735 that contains a portion of the semiconductor material layer 9 in the substrate 8. If the semiconductor material layer 9 includes a single crystalline semiconductor material such as single crystalline silicon, the semiconductor channel 735 of each field effect transistor 701 in the CMOS circuitry 700 may include a single crystalline semiconductor channel such as a single crystalline silicon channel. In one embodiment, a plurality of field effect transistors 701 in the CMOS circuitry 700 may include a respective node that is subsequently electrically connected to a node of a respective ferroelectric memory cell to be subsequently formed. For example, a plurality of field effect transistors 701 in the CMOS circuitry 700 may include a respective source electrode 732 or a respective drain electrode 738 that is subsequently electrically connected to a node of a respective ferroelectric memory cell to be subsequently formed.

In one embodiment, the CMOS circuitry 700 may include a programming control circuit configured to control gate voltages of a set of field effect transistors 701 that are used for programming a respective ferroelectric memory cell and to control gate voltages of thin film transistors to be subsequently formed. In this embodiment, the programming control circuit may be configured to provide a first programming pulse that programs a respective ferroelectric dielectric material layer in a selected ferroelectric memory cell into a first polarization state in which electrical polarization in the ferroelectric dielectric material layer points toward a first electrode of the selected ferroelectric memory cell, and to provide a second programming pulse that programs the ferroelectric dielectric material layer in the selected ferroelectric memory cell into a second polarization state in which the electrical polarization in the ferroelectric dielectric material layer points toward a second electrode of the selected ferroelectric memory cell.

In one embodiment, the substrate 8 may include a single crystalline silicon substrate, and the field effect transistors 701 may include a respective portion of the single crystalline silicon substrate as a semiconducting channel. As used herein, a "semiconducting" element refers to an element having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant.

According to an aspect of the present disclosure, the field effect transistors 701 may be subsequently electrically connected to drain electrodes and gate electrodes of access transistors including semiconducting metal oxide plates to be formed above the field effect transistors 701. In one embodiment, a subset of the field effect transistors 701 may be subsequently electrically connected to at least one of the drain electrodes and the gate electrodes. For example, the field effect transistors 701 may comprise first word line drivers configured to apply a first gate voltage to first word lines through a first subset of lower-level metal interconnect structures to be subsequently formed, and second word line drivers configured to apply a second gate voltage to second word lines through a second subset of the lower-level metal interconnect structures. Further, the field effect transistors 701 may comprise bit line drivers configured to apply a bit line bias voltage to bit lines to be subsequently formed, and sense amplifiers configured to detect electrical current that flows through the bit lines during a read operation.

Various metal interconnect structures formed within dielectric material layers may be subsequently formed over the substrate 8 and the semiconductor devices thereupon (such as field effect transistors 701). In an illustrative example, the dielectric material layers may include, for example, a first dielectric material layer 601 that may be a layer that surrounds the contact structure connected to the source and drains (sometimes referred to as a contact-level dielectric material layer 601), a first interconnect-level dielectric material layer 610, and a second interconnect-level dielectric material layer 620. The metal interconnect structures may include device contact via structures 612 formed in the first dielectric material layer 601 and contacting a respective component of the CMOS circuitry 700, first metal line structures 618 formed in the first interconnect-level dielectric material layer 610, first metal via structures 622 formed in a lower portion of the second interconnect-level dielectric material layer 620, and second metal line structures 628 formed in an upper portion of the second interconnect-level dielectric material layer 620.

Each of the dielectric material layers (601, 610, 620) may include a dielectric material such as undoped silicate glass, a doped silicate glass, organosilicate glass, amorphous fluorinated carbon, porous variants thereof, or combinations thereof. Each of the metal interconnect structures (612, 618, 622, 628) may include at least one conductive material, which may be a combination of a metallic liner (such as a metallic nitride or a metallic carbide) and a metallic fill material. Each metallic liner may include TiN, TaN, WN, TiC, TaC, and WC, and each metallic fill material portion may include W, Cu, Al, Co, Ru, Mo, Ta, Ti, alloys thereof, and/or combinations thereof. Other suitable metallic liner and metallic fill materials within the contemplated scope of disclosure may also be used. In one embodiment, the first metal via structures 622 and the second metal line structures 628 may be formed as integrated line and via structures by a dual damascene process. The dielectric material layers (601, 610, 620) are herein referred to as lower-level dielectric material layers. The metal interconnect structures (612, 618, 622, 628) formed within in the lower-level dielectric material layers are herein referred to as lower-level metal interconnect structures.

While the present disclosure is described using an embodiment wherein thin film transistors may be formed over the second interconnect-level dielectric material layer 620, embodiments are expressly contemplated herein in which the array of memory cells may be formed at a different metal interconnect level. Further, while the present disclosure is described using an embodiment in which a semiconductor substrate is used as the substrate 8, embodiments are expressly contemplated herein in which an insulating substrate or a conductive substrate is used as the substrate 8.

The set of all dielectric material layer that are formed prior to formation of an array of thin film transistors or an array of ferroelectric memory cells is collectively referred to as lower-level dielectric material layers (601, 610, 620). The set of all metal interconnect structures that is formed within the lower-level dielectric material layers (601, 610, 620) is herein referred to as first metal interconnect structures (612, 618, 622, 628). Generally, first metal interconnect structures (612, 618, 622, 628) formed within at least one lower-level dielectric material layer (601, 610, 620) may be formed over the semiconductor material layer 9 that is located in the substrate 8.

According to an aspect of the present disclosure, thin film transistors (TFTs) may be subsequently formed in a metal interconnect level that overlies that metal interconnect levels that contain the lower-level dielectric material layers (601, 610, 620) and the first metal interconnect structures (612, 618, 622, 628). In one embodiment, a planar dielectric material layer having a uniform thickness may be formed over the lower-level dielectric material layers (601, 610, 620). The planar dielectric material layer is herein referred to as a planar insulating spacer layer 635. The planar insulating spacer layer 635 includes a dielectric material such as undoped silicate glass, a doped silicate glass, organosilicate glass, or a porous dielectric material, and may be deposited by chemical vapor deposition. The thickness of the planar insulating spacer layer 635 may be in a range from 20 nm to 300 nm, although lesser and greater thicknesses may also be used.

Generally, interconnect-level dielectric layers (such as the lower-level dielectric material layer (601, 610, 620)) containing therein the metal interconnect structures (such as the first metal interconnect structures (612, 618, 622, 628)) may be formed over semiconductor devices. The planar insulating spacer layer 635 may be formed over the interconnect-level dielectric layers.

An etch stop dielectric layer 636 may be optionally formed over the planar insulating spacer layer 635. The etch stop dielectric layer 636 includes an etch stop dielectric material providing higher etch resistance to an etch chemistry during a subsequently anisotropic etch process that etches a dielectric material to be subsequently deposited over the etch stop dielectric layer 636. For example, the etch stop dielectric layer 636 may include silicon carbide nitride, silicon nitride, silicon oxynitride, or a dielectric metal oxide such as aluminum oxide. Other suitable etch stop materials are within the contemplated scope of disclosure. The thickness of the etch stop dielectric layer 636 may be in a range from 2 nm to 40 nm, such as from 4 nm to 20 nm, although lesser and greater thicknesses may also be used.

Referring to FIGS. 2A-2C, a region of the first exemplary structure is illustrated, which corresponds to an area in which a thin film transistor is to be subsequently formed. While the present disclosure is described using a single instance of a thin film transistor, it is understood that multiple instances of the thin film transistor may be simultaneously formed in any of the exemplary structures of the present disclosure.

An insulating matrix layer 42 may be formed over the planar insulating spacer layer 635 and the optional etch stop dielectric layer 636. The insulating matrix layer 42 may include a dielectric material such as undoped silicate glass, a doped silicate glass, organosilicate glass, or a porous dielectric material, and may be deposited by chemical vapor deposition. The thickness of the insulating matrix layer 42 may be in a range from 20 nm to 300 nm, although lesser and greater thicknesses may also be used. Multiple thin film transistors may be subsequently formed over the insulating matrix layer 42. In one embodiment, the multiple thin film transistors may be arranged along a first horizontal direction hd1 and a second horizontal direction hd2, which may be perpendicular to the first horizontal direction hd1.

Referring to FIGS. 3A-3C, a photoresist layer 47 may be applied over a top surface of the insulating matrix layer 42, and may be lithographically patterned to form an opening within the illustrated area. In one embodiment, the opening may be a rectangular opening having a pair of widthwise sidewalls along the first horizontal direction hd1 and having a pair of lengthwise sidewalls along the second horizontal direction hd2. An anisotropic etch process may be performed to transfer the pattern of the openings in the photoresist layer 47 into an upper portion of the insulating matrix layer 42. An opening 11 may be formed in an upper portion of the insulating matrix layer 42. The opening 11 is also referred to as a bottom gate opening.

In one embodiment, the width of the opening 11 along the first horizontal direction hd1 may be in a range from 20 nm to 300 nm, although lesser and greater widths may also be used. In one embodiment, the length of the opening 11 along the second horizontal direction hd2 may be in a range from 30 nm to 3,000 nm, although lesser and greater lengths may also be used. The depth of the opening 11 may be the same as the thickness of the insulating matrix layer 42. Thus, a top surface of the optional etch stop dielectric layer 636 or a top surface of the planar insulating spacer layer 635 (in embodiments in which the etch stop dielectric layer 636 is not used) is exposed. The photoresist layer 47 may be subsequently removed, for example, by ashing.

Referring to FIGS. 4A-4C, a hydrogen-blocking dielectric barrier layer 44 may be formed over the insulating matrix layer 42 and planar insulating spacer layer 635 and the optional etch stop dielectric layer 636. The hydrogen-blocking dielectric barrier layer 44 includes a dielectric material that blocks hydrogen diffusion therethrough. In order to provide a continuous hydrogen-blocking structure, the hydrogen-blocking dielectric barrier layer 44 may continuously extend over a bottom surface and sidewalls of the opening 11 and over a top surface of the insulating matrix layer 42.

In one embodiment, the hydrogen-blocking dielectric barrier layer 44 comprises, and/or consists of, a dielectric metal oxide liner including a dielectric metal oxide material. The dielectric metal oxide liner of the hydrogen-blocking dielectric barrier layer 44 may be deposited at the bottom surface and the sidewalls of the opening 11 and over the top surface of the insulating matrix layer 42. In one embodiment, the dielectric metal oxide liner of the hydrogen-blocking dielectric barrier layer 44 may be deposited directly on physically exposed surfaces of the insulating matrix layer 42 and a physically exposed surface of the etch stop dielectric layer 636 (or a physically exposed surface of the planar insulating spacer layer 635 in embodiments in which an etch stop dielectric layer is not used).

In one embodiment, the dielectric metal oxide liner of the hydrogen-blocking dielectric barrier layer 44 comprises, and/or consists of, a material selected from aluminum oxide and a dielectric transition metal oxide. In one embodiment, the hydrogen-blocking dielectric barrier layer 44 comprises, and/or consists essentially of, a material selected from aluminum oxide, chromium oxide, titanium oxide, yttrium oxide, zirconium oxide, lanthanum oxide, hafnium oxide, tantalum oxide, a compound thereof, a homogenized mixture thereof, and a layer stack thereof. In one embodiment, the hydrogen-blocking dielectric barrier layer 44 comprises, and/or consists essentially of, a material selected from aluminum oxide, chromium oxide, hafnium oxide, a homogenized mixture thereof, and a layer stack thereof. In one embodiment, the hydrogen-blocking dielectric barrier layer 44 comprises, and/or consists essentially of, a material selected from chromium oxide, hafnium oxide, a homogenized mixture thereof, and a layer stack thereof. In one embodiment, the hydrogen-blocking dielectric barrier layer 44 comprises, and/or consists essentially of, aluminum oxide. Generally, the thickness of the hydrogen-blocking dielectric barrier layer 44 may be optimized depending on the residual hydrogen content within adjacent dielectric material layers such as the insulating matrix layer 42. In embodiments in which the insulating matrix layer 42 is deposited by atomic layer deposition, the thickness of the hydrogen-blocking dielectric barrier layer 44 may be less. In embodiments in which the insulating matrix layer 42 is deposited by chemical vapor deposition, the thickness of the hydrogen-blocking dielectric barrier layer 44 may be greater.

The hydrogen-blocking dielectric barrier layer 44 may be deposited by physical vapor deposition, chemical vapor deposition, atomic layer deposition, or a combination thereof. In one embodiment, the hydrogen-blocking dielectric barrier layer 44 may be deposited by physical vapor deposition to reduce the content of residual hydrogen atoms that are incorporated into the hydrogen-blocking dielectric barrier layer 44 during the deposition process. The hydrogen-blocking dielectric barrier layer 44 may be conformal, i.e., may have the same thickness throughout. In some embodiments, a Chemical vapor deposition (CVD) or atomic layer deposition (ALD) process may be preferred for some materials because they may provide conformity and better thickness control. However, in other embodiments, a physical vapor deposition (PVD) process may be preferred for some other materials because collateral hydrogen incorporation from a precursor gas may be avoided. According to an aspect of the present disclosure, the thickness of the hydrogen-blocking dielectric barrier layer 44 may be selected such that the hydrogen-blocking dielectric barrier layer 44 may be effective as a hydrogen-blocking barrier layer. For example, if the hydrogen-blocking dielectric barrier layer 44 consists of aluminum oxide, the thickness of the hydrogen-blocking dielectric barrier layer 44 may be at least 10 nm, and preferably at least 12 nm, such as 15 nm or more to effectively function as a hydrogen-blocking structure. In one embodiment, the hydrogen-blocking dielectric barrier layer 44 consists of aluminum oxide, and the thickness of the hydrogen-blocking dielectric barrier layer 44 may be in a range from 10 nm to 50 nm, such as from 12 nm to 35 nm and/or from 15 nm to 25 nm. Generally, the hydrogen-blocking dielectric barrier layer 44 may include any one or more of the dielectric metal oxide materials described above, and may have a thickness in a range from 10 nm to 50 nm, such as from 12 nm to 35 nm and/or from 15 nm to 25 nm.

Referring to FIGS. 5A-5C, at least one conductive material may be deposited in a remaining volume of the opening 11. The at least one conductive material may include, for example, a metallic barrier liner material (such as TiN, TaN, and/or WN) and a metallic fill material (such as Cu, W, Mo, Co, Ru, etc.). Other suitable metallic liner and metallic fill materials within the contemplated scope of disclosure may also be used. Excess portions of the at least one conductive material may be removed from above the horizontal plane including the top surface of the hydrogen-blocking dielectric barrier layer 44 by a planarization process, which may include a chemical mechanical polishing (CMP) process and/or a recess etch process. A bottom gate electrode 15 may be formed in the opening 11. The planarization process may use a chemical mechanical polishing process or a recess etch process. The top surface of the bottom gate electrode 15 may be located within a same horizontal plane as the topmost surface of the hydrogen-blocking dielectric barrier layer 44. In one embodiment, the horizontally-extending portion of the hydrogen-blocking dielectric barrier layer 44 overlying the insulating matrix layer 42 may have the same thickness as a horizontally-extending portion of the hydrogen-blocking dielectric barrier layer 44 underlying, and contacting a bottom surface of, the bottom gate electrode 15. Alternatively, the horizontally-extending portion of the hydrogen-blocking dielectric barrier layer 44 overlying the insulating matrix layer 42 may be collaterally thinned during the planarization process. In this embodiment, the horizontally-extending portion of the hydrogen-blocking dielectric barrier layer 44 overlying the insulating matrix layer 42 may be thinner than the horizontally-extending portion of the hydrogen-blocking dielectric barrier layer 44 underlying, and contacting the bottom surface of, the bottom gate electrode 15. Generally, the thickness of the horizontally-extending portion of the hydrogen-blocking dielectric barrier layer 44 overlying the insulating matrix layer 42 may have a thickness in a range from 10 nm to 50 nm.

Figure 6A:
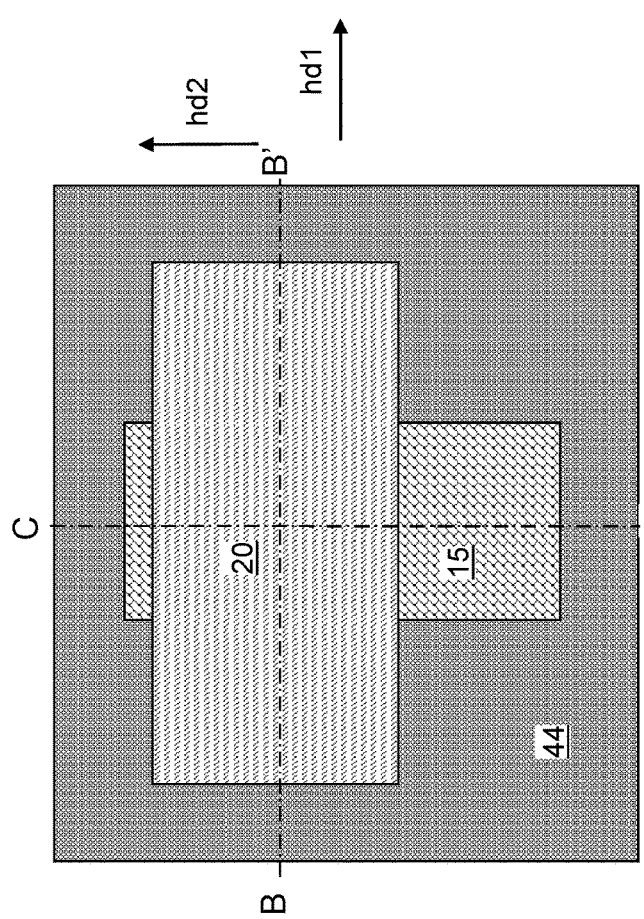
FIG. 6A is a top-down view of a region of the first exemplary structure after formation of a bottom gate dielectric and a semiconducting metal oxide plate according to the first embodiment of the present disclosure.
Figure 6C:
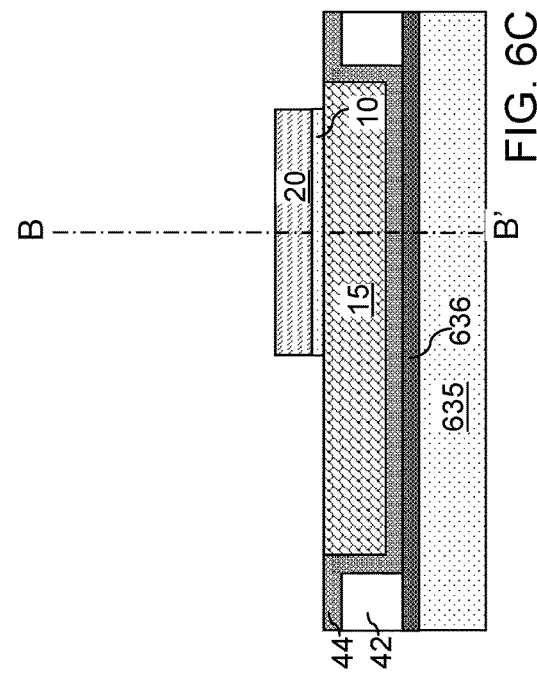
FIG. 6C is a vertical cross-sectional view of the first exemplary structure along the vertical plane C-C' of FIG. 6A.
Figure 6B:
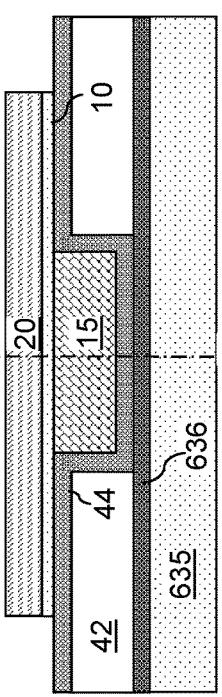
FIG. 6B is a vertical cross-sectional view of the first exemplary structure along the vertical plane B-B' of FIG. 6A.

Referring to FIGS. 6A-6C, a continuous bottom gate dielectric layer and a continuous semiconducting metal oxide layer may be sequentially deposited over the hydrogen-blocking dielectric barrier layer 44 and the bottom gate electrode 15 as continuous material layers. The continuous bottom gate dielectric layer may be formed over the hydrogen-blocking dielectric barrier layer 44 and the bottom gate electrode 15 by deposition of at least one gate dielectric material. The gate dielectric material may include, but is not limited to, silicon oxide, silicon oxynitride, a dielectric metal oxide (such as aluminum oxide, hafnium oxide, yttrium oxide, lanthanum oxide, etc.), or a stack thereof. Other suitable dielectric materials are within the contemplated scope of disclosure. The gate dielectric material is different from the material of the hydrogen-blocking dielectric barrier layer 44. The gate dielectric material may be deposited by atomic layer deposition or chemical vapor deposition. The thickness of the continuous bottom gate dielectric layer may be in a range from 1 nm to 12 nm, such as from 2 nm to 6 nm, although lesser and greater thicknesses may also be used.

The continuous semiconducting metal oxide layer may be deposited over the continuous bottom gate dielectric layer. In one embodiment, the semiconducting material includes a material providing electrical conductivity in a range from 1.0 S/m to $1.0 \times 10^5$ S/m upon suitable doping with electrical dopants (which may be p-type dopants or n-type dopants). Exemplary semiconducting materials that may be used for the continuous semiconducting metal oxide layer include, but are not limited to, indium gallium zinc oxide (IGZO), indium tungsten oxide, indium zinc oxide, indium tin oxide, indium gallium oxide, indium oxide, doped zinc oxide, doped indium oxide, doped cadmium oxide, and various other doped variants derived therefrom. Other suitable semiconducting materials are within the contemplated scope of disclosure. In one embodiment, the semiconducting material of the continuous semiconducting metal oxide layer may include indium gallium zinc oxide.

The continuous semiconducting metal oxide layer may include a polycrystalline semiconducting material, or an amorphous semiconducting material that may be subsequently annealed into a polycrystalline semiconducting material having a greater average grain size. The continuous semiconducting metal oxide layer may be deposited by physical vapor deposition although other suitable deposition processes may be used. The thickness of the continuous semiconducting metal oxide layer may be in a range from 1 nm to 100 nm, such as from 2 nm to 50 nm and/or from 4 nm to 15 nm, although lesser and greater thicknesses may also be used.

A photoresist layer (not illustrated) may be applied over the continuous semiconducting metal oxide layer, and may be lithographically patterned to form discrete patterned photoresist material portions straddling a respective bottom gate electrode 15 along the first horizontal direction hd1. In one embodiment, each patterned portion of the photoresist layer may have a horizontal cross-sectional shape of a rectangle or a rounded rectangle. The pattern in the photoresist layer may be transferred through the continuous semiconducting metal oxide layer and the continuous bottom gate dielectric layer by performing an anisotropic etch process. Each patterned portion of the continuous semiconducting metal oxide layer comprises a semiconducting metal oxide plates 20. Each patterned portion of the continuous bottom gate dielectric layer comprises a bottom gate dielectric 10.

In one embodiment, each semiconducting metal oxide plate 20 may have a horizontal cross-sectional shape of a rectangle or a rounded rectangle. In one embodiment, each semiconducting metal oxide plate 20 may have a lateral dimension along the first horizontal direction hd1 in a range from 60 nm to 1,000 nm, such as from 100 nm to 300 nm, although lesser and greater lateral dimensions may also be used. In one embodiment, each semiconducting metal oxide plate 20 may have a lateral dimension along the second horizontal direction hd2 in a range from 20 nm to 500 nm, such as from 40 nm to 250 nm, although lesser and greater lateral dimensions may also be used. The ratio of the lateral dimension along the first horizontal direction hd1 to the lateral dimension along the second horizontal direction hd2 in each semiconducting metal oxide plate 20 may be in a range from 0.5 to 4, such as from 1 to 2, although lesser and greater ratios may also be used. Generally, a vertical stack of a bottom gate electrode 15, a bottom gate dielectric 10, and a semiconducting metal oxide plate 20 may be formed over lower-level dielectric material layers (601, 610, 620) that overlies a substrate 8. The sidewalls of the bottom gate dielectric 10 and the semiconducting metal oxide plate 20 may be vertically coincident, i.e., may be located within same vertical planes. The photoresist layer may be subsequently removed, for example, by ashing.

Referring to FIGS. 7A-7C, a capping hydrogen-blocking dielectric barrier layer 46 may be formed over the semiconducting metal oxide plate 20. The capping hydrogen-blocking dielectric barrier layer 46 may include any dielectric material that may be used for the hydrogen-blocking dielectric barrier layer 44. In order to provide a continuous capping hydrogen-blocking structure, the capping hydrogen-blocking dielectric barrier layer 46 may continuously extend over the top surface and sidewalls of the semiconducting metal oxide plate 20, over sidewalls of the bottom gate dielectric 10, and directly on the physically exposed portions of the top surface of the hydrogen-blocking dielectric barrier layer 44.

In one embodiment, the capping hydrogen-blocking dielectric barrier layer 46 comprises, and/or consists of, a dielectric metal oxide liner including a dielectric metal oxide material. The dielectric metal oxide liner of the capping hydrogen-blocking dielectric barrier layer 46 may be deposited directly on physically exposed surfaces of the semiconducting metal oxide plate 20, the bottom gate dielectric 10, and the bottom gate electrode 15.

In one embodiment, the dielectric metal oxide liner of the capping hydrogen-blocking dielectric barrier layer 46 comprises, and/or consists of, a material selected from aluminum oxide and a dielectric transition metal oxide. In one embodiment, the capping hydrogen-blocking dielectric barrier layer 46 comprises, and/or consists essentially of, a material selected from aluminum oxide, chromium oxide, titanium oxide, yttrium oxide, zirconium oxide, lanthanum oxide, hafnium oxide, tantalum oxide, a compound thereof, a homogenized mixture thereof, and a layer stack thereof. In one embodiment, the capping hydrogen-blocking dielectric barrier layer 46 comprises, and/or consists essentially of, a material selected from aluminum oxide, chromium oxide, hafnium oxide, a homogenized mixture thereof, and a layer stack thereof. In one embodiment, the capping hydrogen-blocking dielectric barrier layer 46 comprises, and/or consists essentially of, a material selected from chromium oxide, hafnium oxide, a homogenized mixture thereof, and a layer stack thereof. In one embodiment, the capping hydrogen-blocking dielectric barrier layer 46 comprises, and/or consists essentially of, aluminum oxide.

The capping hydrogen-blocking dielectric barrier layer 46 may be deposited by physical vapor deposition, chemical vapor deposition, atomic layer deposition, or a combination thereof. The capping hydrogen-blocking dielectric barrier layer 46 may be conformal, i.e., may have the same thickness throughout. According to an aspect of the present disclosure, the thickness of the capping hydrogen-blocking dielectric barrier layer 46 may be selected such that the capping hydrogen-blocking dielectric barrier layer 46 is effective as a capping hydrogen-blocking barrier layer. For example, if the capping hydrogen-blocking dielectric barrier layer 46 consists of aluminum oxide, the thickness of the capping hydrogen-blocking dielectric barrier layer 46 may be at least 10 nm, and preferably at least 12 nm, such as 15 nm or more to effectively function as a capping hydrogen-blocking structure. In one embodiment, the capping hydrogen-blocking dielectric barrier layer 46 consists of aluminum oxide, and the thickness of the capping hydrogen-blocking dielectric barrier layer 46 may be in a range from 10 nm to 50 nm, such as from 12 nm to 35 nm and/or from 15 nm to 25 nm. Generally, the capping hydrogen-blocking dielectric barrier layer 46 may include any one or more of the dielectric metal oxide materials described above, and may have a thickness in a range from 10 nm to 50 nm, such as from 12 nm to 35 nm and/or from 15 nm to 25 nm.

A dielectric material layer may be deposited over the capping hydrogen-blocking dielectric barrier layer 46. The dielectric material layer is herein referred to as an electrode-level dielectric material layer 48. The electrode-level dielectric material layer 48 includes a dielectric material such as undoped silicate glass, a doped silicate glass, organosilicate glass, or a stack thereof. Optionally, the electrode-level dielectric material layer 48 may be planarized to provide a flat top surface. The thickness of the electrode-level dielectric material layer 48, as measured from a top surface of a portion of the capping hydrogen-blocking dielectric barrier layer 46 that does not have any areal overlap with the semiconducting metal oxide plate 20, may be in a range from 100 nm to 1,000 nm, such as from 200 nm to 500 nm, although lesser and greater thicknesses may also be used. The set of the insulating matrix layer 42, the hydrogen-blocking dielectric barrier layer 44, the capping hydrogen-blocking dielectric barrier layer 46, and the electrode-level dielectric material layer 48 is herein referred to as a thin-film-transistor-level (TFT-level) dielectric material layer 40, i.e., a dielectric material layer that is located at the level of thin film transistors.

Referring to FIGS. 8A-8C, a photoresist layer (not shown) may be applied over the TFT-level dielectric material layer 40, and may be lithographically patterned to form discrete openings therein. The pattern of the discrete openings in the photoresist layer may be transferred through the electrode-level dielectric material layer 48 and the capping hydrogen-blocking dielectric barrier layer 46 by at least one etch process to form a source cavity 51, a drain cavity 59, and a bottom gate contact via cavity 19. The at least one etch process may comprise a first anisotropic etch process that etches the material of the electrode-level dielectric material layer 48 selective to the material of the capping hydrogen-blocking dielectric barrier layer 46, and an isotropic etch process or a second anisotropic etch process that etches the material of the capping hydrogen-blocking dielectric barrier layer 46 selective to the material of the semiconducting metal oxide plate 20.

The source cavity 51 and the drain cavity 59 may be formed at opposite ends of the semiconducting metal oxide plate 20, and may be laterally spaced from each other along the first horizontal direction hd1. In one embodiment, an end sidewall of the semiconducting metal oxide plate 20 laterally extending along the second horizontal direction hd2 and a pair of sidewall segments of the semiconducting metal oxide plate 20 laterally extending along the first horizontal direction hd1 may be physically exposed at the bottom of each of the source cavity 51 and the drain cavity 59. In one embodiment, an end sidewall of the bottom gate dielectric 10 laterally extending along the second horizontal direction hd2 and a pair of sidewall segments of the bottom gate dielectric 10 laterally extending along the first horizontal direction hd1 may be physically exposed at the bottom of each of the source cavity 51 and the drain cavity 59. A rectangular portion of the top surface of the semiconducting metal oxide plate 20 may be physically exposed at the bottom of each of the source cavity 51 and the drain cavity 59. A top surface of the bottom gate electrode 15 may be physically exposed at the bottom of the backside electrode contact via cavity 19. The photoresist layer may be subsequently removed, for example, by ashing.

Referring to FIGS. 9A-9C, at least one conductive material may be deposited in the cavities (51, 19, 59) and over the TFT-level dielectric material layer 40. The at least one conductive material may include a metallic liner material and a metallic fill material. The metallic liner material may include a conductive metallic nitride or a conductive metallic carbide such as TiN, TaN, WN, TiC, TaC, and/or WC. The metallic fill material may include W, Cu, Al, Co, Ru, Mo, Ta, Ti, alloys thereof, and/or combinations thereof. Other suitable materials within the contemplated scope of disclosure may also be used.

Excess portions of the at least one conductive material may be removed from above the horizontal plane including the top surface of the TFT-level dielectric material layer 40 by a planarization process, which may use a CMP process and/or a recess etch process. Other suitable planarization processes may be used. Each remaining portion of the at least one conductive material filling a source cavity 51 constitutes a source electrode 52. Each remaining portion of the at least one conductive material filling a drain cavity 59 constitutes a drain electrode 56. Each remaining portion of the at least one conductive material filling a backside electrode contact via cavity 19 constitutes a backside electrode contact via structure 18, which contacts a top surface of the bottom gate electrode 15.

In one embodiment, each source electrode 52 may include a source metallic liner 53 that is a remaining portion of the metallic liner material, and a source metallic fill material portion 54 that is a remaining portion of the metallic fill material. Each drain electrode 56 may include a drain metallic liner 57 that is a remaining portion of the metallic liner material, and a drain metallic fill material portion 58 that is a remaining portion of the metallic fill material. Each backside electrode contact via structure 18 may include a bottom gate contact metallic liner 16 that is a remaining portion of the metallic liner material, and a bottom gate contact metallic fill material portion 17 that is a remaining portion of the metallic fill material.

The semiconducting metal oxide plate 20 and a set of electrode structures (52, 15, 56) may be formed within a TFT-level dielectric material layer 40. Top surfaces of the source electrode 52, the drain electrode 56, and the bottom gate electrode contact structure 18 may be located within (i.e., may be co-planar with) a horizontal plane including a top surface of the TFT-level dielectric material layer 40.

Referring to FIGS. 10A-10C, a first alternative configuration of the first exemplary structure according to the first embodiment of the present disclosure may be derived from the first exemplary structure illustrated in FIGS. 9A-9C by omitting formation of the capping hydrogen-blocking dielectric barrier layer 46. In this embodiment, the electrode-level dielectric material layer 48 may be formed directly on the semiconducting metal oxide plate 20 and on physically exposed surfaces of the bottom gate dielectric 10, the bottom gate electrode 15, and the hydrogen-blocking dielectric barrier layer 44.

Referring to FIGS. 11A-11C, a second alternative configuration of the first exemplary structure according to the first embodiment of the present disclosure may be derived from the first exemplary structure of FIGS. 9A-9C by using a layer stack for the hydrogen-blocking dielectric barrier layer 44. In this embodiment, the hydrogen-blocking dielectric barrier layer 44 may include a layer stack including, from bottom to top, a silicon nitride liner 44A and a dielectric metal oxide liner 44B. The silicon nitride liner 44A comprises, and/or consists essentially of, silicon nitride, and may have a thickness in a range from 2 nm to 20 nm, such as from 2 nm to 10 nm. The silicon nitride liner 44A is vertically spaced from the semiconducting metal oxide plate 20 by the dielectric metal oxide liner 44B to prevent formation of charge trapping states. The dielectric metal oxide liner 44B may include any dielectric metal oxide material that may be used for the dielectric metal oxide liner of the hydrogen-blocking dielectric barrier layer 44 illustrated in FIGS. 4A-4C and described above.

According to an aspect of the present disclosure, the thickness of the dielectric metal oxide liner 44B may be selected such that the dielectric metal oxide liner 44B is effective as a hydrogen-blocking barrier layer. For example, if the dielectric metal oxide liner 44B consists of aluminum oxide, the thickness of the dielectric metal oxide liner 44B may be at least 10 nm, and preferably at least 12 nm, such as 15 nm or more to effectively function as a hydrogen-blocking structure. In one embodiment, the dielectric metal oxide liner 44B consists of aluminum oxide, and the thickness of the dielectric metal oxide liner 44B may be in a range from 10 nm to 50 nm, such as from 12 nm to 35 nm and/or from 15 nm to 25 nm. Generally, the dielectric metal oxide liner 44B may include any one or more of the dielectric metal oxide materials described above, and may have a thickness in a range from 10 nm to 50 nm, such as from 12 nm to 35 nm and/or from 15 nm to 25 nm. In one embodiment, the planarization process that forms the bottom gate electrode 15 may be selective to the material of the dielectric metal oxide liner 44B such that the dielectric metal oxide liner 44B covers, and overlies, a horizontally-extending portion of the silicon nitride liner 44A outside the area of the bottom gate dielectric 10.

Referring to FIGS. 12A-12C, a third alternative configuration of the first exemplary structure according to the first embodiment of the present disclosure may be derived from the second alternative configuration of the first exemplary structure illustrated in FIGS. 11A-11C by omitting formation of the capping hydrogen-blocking dielectric barrier layer 46. In this embodiment, the electrode-level dielectric material layer 48 may be formed directly on the semiconducting metal oxide plate 20 and on physically exposed surfaces of the bottom gate dielectric 10, the bottom gate electrode 15, and the hydrogen-blocking dielectric barrier layer 44.

Referring to FIGS. 13A-13C, a fourth alternative configuration of the first exemplary structure according to the first embodiment of the present disclosure may be derived from the first exemplary structure of FIGS. 9A-9C by using a layer stack for the hydrogen-blocking dielectric barrier layer 44. In this embodiment, the hydrogen-blocking dielectric barrier layer 44 may include a layer stack including, from bottom to top, a dielectric metal oxide liner 44B and a silicon nitride liner 44A. The dielectric metal oxide liner 44B may include any dielectric metal oxide material that may be used for the dielectric metal oxide liner of the hydrogen-blocking dielectric barrier layer 44 illustrated in FIGS. 4A-4C and described above. The silicon nitride liner 44A comprises, and/or consists essentially of, silicon nitride, and may have a thickness in a range from 2 nm to 20 nm, such as from 2 nm to 10 nm.

The horizontally-extending portion of the silicon nitride liner 44A that overlies the insulating matrix layer 42 may be removed during a planarization process that forms the bottom gate electrode 15. For example, the planarization process used to form the bottom gate electrode 15 may include a chemical mechanical polishing step that collaterally removes the horizontally-extending portion of the silicon nitride liner 44A during polishing of the at least one metallic material of the bottom gate electrode 15. The top surface of the horizontally-extending portion of the dielectric metal oxide liner 44B may be physically exposed outside the area of the bottom gate electrode 15 after the chemical mechanical polishing process. The bottom gate dielectric 10, the source electrode 52, the drain electrode 56, and the capping hydrogen-blocking dielectric barrier layer 46 may be formed directly on a top surface of the dielectric metal oxide liner 44B. Contact between the silicon nitride liner 44A and the bottom gate dielectric 10 may be minimized to two strips that laterally extend along the second horizontal direction hd2.

Subsequently, the processing steps of FIGS. 5A-9C may be performed to form the fourth alternative configuration of the first exemplary structure illustrated in FIGS. 13A-13C.

Referring to FIGS. 14A-14C, a fifth alternative configuration of the first exemplary structure according to the first embodiment of the present disclosure may be derived from the fourth alternative configuration of the first exemplary structure illustrated in FIGS. 13A-13C by omitting formation of the capping hydrogen-blocking dielectric barrier layer 46. In this embodiment, the electrode-level dielectric material layer 48 may be formed directly on the semiconducting metal oxide plate 20 and on physically exposed surfaces of the bottom gate dielectric 10, the bottom gate electrode 48, and the hydrogen-blocking dielectric barrier layer 44.

Figure 15C:
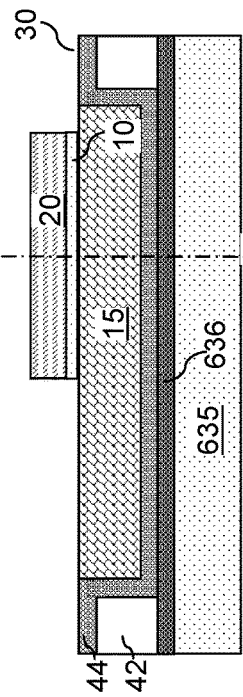
FIG. 15C is a vertical cross-sectional view of the second exemplary structure along the vertical plane C-C' of FIG. 15A.
Figure 15A:
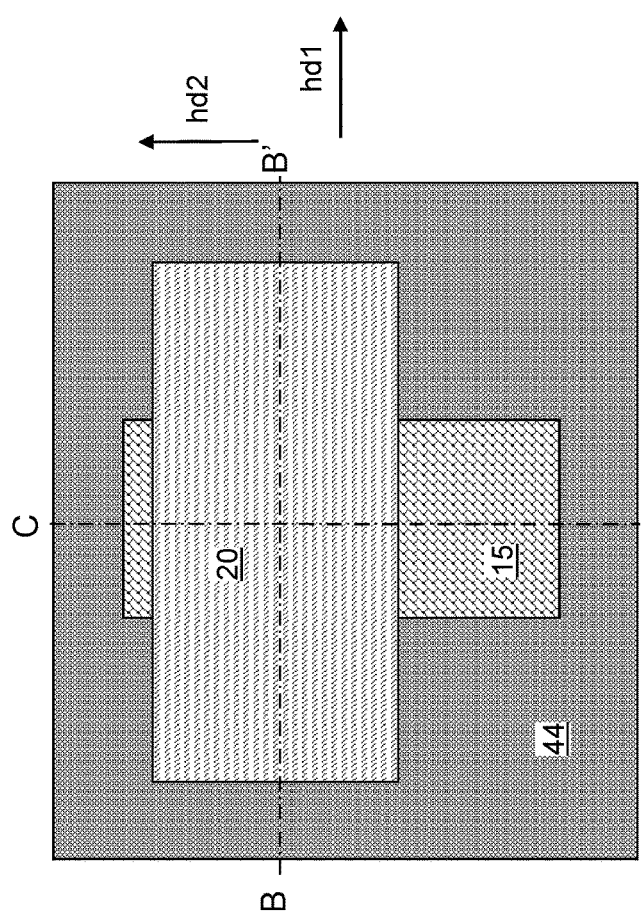
FIG. 15A is a top-down view of a region of a second exemplary structure after formation of a bottom gate dielectric and a semiconducting metal oxide plate according to a second embodiment of the present disclosure.
Figure 15B:
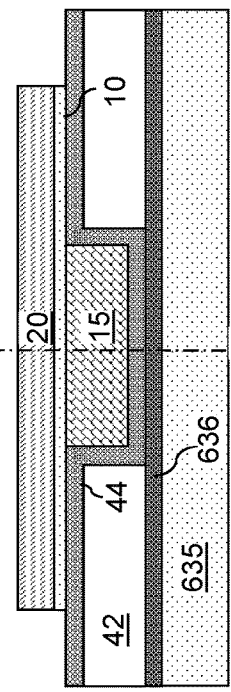
FIG. 15B is a vertical cross-sectional view of the second exemplary structure along the vertical plane B-B' of FIG. 15A.

Referring to FIGS. 15A-15C, a second exemplary structure according to a second embodiment of the present disclosure is illustrated. The second exemplary structure of FIGS. 15A-15C may be the same as the first exemplary structure of FIGS. 6A-6C.

Figure 16C:
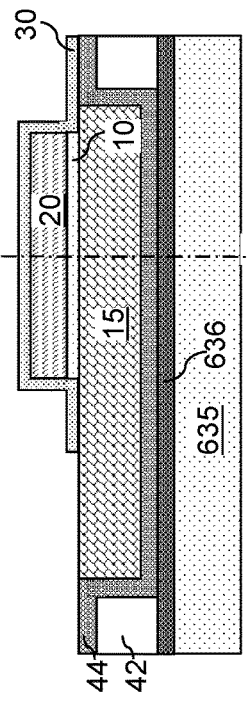
FIG. 16C is a vertical cross-sectional view of the second exemplary structure along the vertical plane C-C' of FIG. 16A.
Figure 16A:
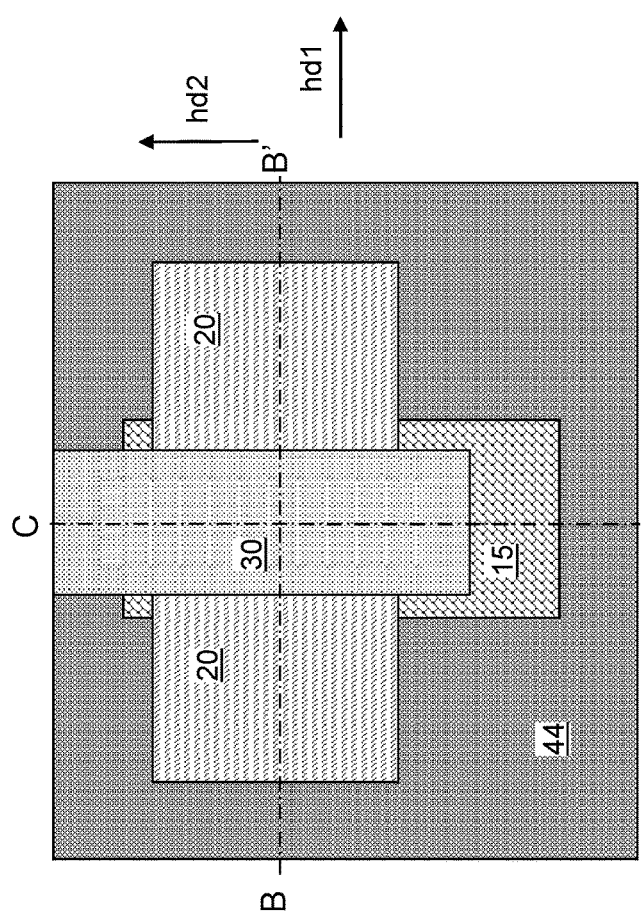
FIG. 16A is a top-down view of a region of a second exemplary structure after formation of a top gate dielectric according to the second embodiment of the present disclosure.
Figure 16B:
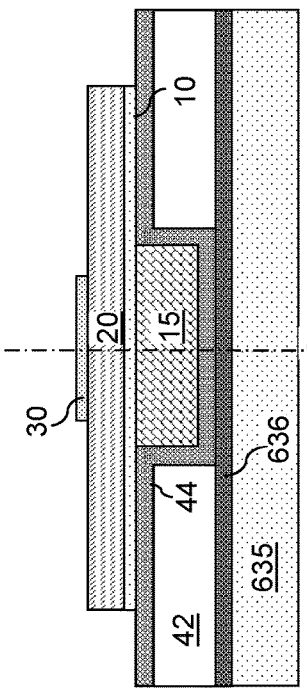
FIG. 16B is a vertical cross-sectional view of the second exemplary structure along the vertical plane B-B' of FIG. 16A.

Referring to FIGS. 16A-16C, a top gate dielectric 30 may be formed by depositing a continuous top gate dielectric layer including a gate dielectric material, and by patterning the continuous top gate dielectric layer, for example, by applying and patterning a photoresist layer over the continuous top gate dielectric layer and by transferring the pattern in the photoresist layer into the continuous top gate dielectric layer. Unmasked portions of the continuous top gate dielectric layer may be removed by a selective etch process that etches the material of the continuous top gate dielectric layer selective to the material of the semiconducting metal oxide plate 20. The selective etch process may include an isotropic etch process or an anisotropic etch process. The photoresist layer may be removed, for example, by an ashing process.

The top gate dielectric 30 straddles the semiconducting metal oxide plate 20 along the second horizontal direction hd2. The top gate dielectric 30 may include any of the materials that may be used for the bottom gate dielectric 10, and may have a thickness in a range from 1 nm to 12 nm, such as from 2 nm to 6 nm, although lesser and greater thicknesses may also be used.

Referring to FIGS. 17A-17C, the processing steps of FIGS. 7A-7C may be performed to form a capping hydrogen-blocking dielectric barrier layer 46 and an electrode-level dielectric material layer 48. The set of the insulating matrix layer 42, the hydrogen-blocking dielectric barrier layer 44, the capping hydrogen-blocking dielectric barrier layer 46, and the electrode-level dielectric material layer 48 is herein referred to as a thin-film-transistor-level (TFT-level) dielectric material layer 40, i.e., a dielectric material layer that is located at the level of thin film transistors.

Referring to FIGS. 18A-18C, the processing steps of FIGS. 8A-8C may be performed with a modification to the pattern of the openings in the photoresist layer to form a source cavity 51, a drain cavity 59, a backside electrode contact via cavity 19, and a top gate electrode cavity 39. Each of the source cavity 51, the drain cavity 59, and the backside electrode contact via cavity 19 may have a same geometry as in the first exemplary structure of FIGS. 8A-8C. The top electrode gate cavity 39 may be formed within the area of the top gate dielectric 30. In one embodiment, the top gate electrode cavity 39 may straddle the semiconducting metal oxide plate 20 along the second horizontal direction hd2 with a uniform width along the first horizontal direction hd1.

The source cavity 51 and the drain cavity 59 may be formed at opposite ends of the semiconducting metal oxide plate 20, and may be laterally spaced from each other along the first horizontal direction hd1. In one embodiment, an end sidewall of the semiconducting metal oxide plate 20 laterally extending along the second horizontal direction hd2 and a pair of sidewall segments of the semiconducting metal oxide plate 20 laterally extending along the first horizontal direction hd1 may be physically exposed at the bottom of each of the source cavity 51 and the drain cavity 59. In one embodiment, an end sidewall of the bottom gate dielectric 10 laterally extending along the second horizontal direction hd2 and a pair of sidewall segments of the bottom gate dielectric 10 laterally extending along the first horizontal direction hd1 may be physically exposed at the bottom of each of the source cavity 51 and the drain cavity 59. A rectangular portion of the top surface of the semiconducting metal oxide plate 20 may be physically exposed at the bottom of each of the source cavity 51 and the drain cavity 59. A top surface of the bottom gate electrode 15 may be physically exposed at the bottom of the backside electrode contact via cavity 19. The photoresist layer may be subsequently removed, for example, by ashing.

Referring to FIGS. 19A-19C, the processing steps of FIGS. 9A-9C may be performed to deposit at least one conductive material in the cavities (51, 19, 39, 59) and over the TFT-level dielectric material layer 40, and to remove excess portions of the at least one conducive material from above the horizontal plane including the top surface of the TFT-level dielectric material layer 40. Each remaining portion of the at least one conductive material filling a source cavity 51 constitutes a source electrode 52. Each remaining portion of the at least one conductive material filling a drain cavity 59 constitutes a drain electrode 56. Each remaining portion of the at least one conductive material filling a backside electrode contact via cavity 19 constitutes a backside electrode contact via structure 18, which contacts a top surface of the bottom gate electrode 15. Each remaining portion of the at least one conductive material filling a top gate electrode cavity 39 constitutes a top gate electrode 35.

In one embodiment, each source electrode 52 may include a source metallic liner 53 that is a remaining portion of the metallic liner material, and a source metallic fill material portion 54 that is a remaining portion of the metallic fill material. Each drain electrode 56 may include a drain metallic liner 57 that is a remaining portion of the metallic liner material, and a drain metallic fill material portion 58 that is a remaining portion of the metallic fill material. Each backside electrode contact via structure 18 may include a bottom gate contact metallic liner 16 that is a remaining portion of the metallic liner material, and a bottom gate contact metallic fill material portion 17 that is a remaining portion of the metallic fill material. Each top gate electrode 35 may include a top gate electrode metallic liner 36 that is a remaining portion of the metallic liner material, and a top gate electrode metallic fill material portion 37 that is a remaining portion of the metallic fill material.

The semiconducting metal oxide plate 20 and a set of electrode structures (52, 15, 35, 56) may be formed within a TFT-level dielectric material layer 40. Top surfaces of the source electrode 52, the drain electrode 56, the top gate electrode 35, and the bottom gate electrode contact structure 18 may be located within (i.e., may be co-planar with) a horizontal plane including a top surface of the TFT-level dielectric material layer 40.

Referring to FIGS. 20A-20C, a first alternative configuration of the second exemplary structure according to the second embodiment of the present disclosure may be derived from the second exemplary structure illustrated in FIGS. 19A-19C by omitting formation of the capping hydrogen-blocking dielectric barrier layer 46. In this embodiment, the electrode-level dielectric material layer 48 may be formed directly on the semiconducting metal oxide plate 20 and on physically exposed surfaces of the bottom gate dielectric 10, the bottom gate electrode 48, and the hydrogen-blocking dielectric barrier layer 44.

Referring to FIGS. 21A-21C, a second alternative configuration of the second exemplary structure according to the second embodiment of the present disclosure may be derived from the second exemplary structure of FIGS. 19A-19C by using a layer stack for the hydrogen-blocking dielectric barrier layer 44. In this embodiment, the hydrogen-blocking dielectric barrier layer 44 may include a layer stack including, from bottom to top, a silicon nitride liner 44A and a dielectric metal oxide liner 44B. The silicon nitride liner 44A comprises, and/or consists essentially of, silicon nitride, and may have a thickness in a range from 2 nm to 20 nm, such as from 2 nm to 10 nm. The silicon nitride liner 44A is vertically spaced from the semiconducting metal oxide plate 20 by the dielectric metal oxide liner 44B to prevent formation of charge trapping states. The dielectric metal oxide liner 44B may include any dielectric metal oxide material that may be used for the dielectric metal oxide liner of the hydrogen-blocking dielectric barrier layer 44 illustrated in FIGS. 4A-4C and described above.

According to an aspect of the present disclosure, the thickness of the dielectric metal oxide liner 44B may be selected such that the dielectric metal oxide liner 44B is effective as a hydrogen-blocking barrier layer. For example, if the dielectric metal oxide liner 44B consists of aluminum oxide, the thickness of the dielectric metal oxide liner 44B may be at least 10 nm, and preferably at least 12 nm, such as 15 nm or more to effectively function as a hydrogen-blocking structure. In one embodiment, the dielectric metal oxide liner 44B consists of aluminum oxide, and the thickness of the dielectric metal oxide liner 44B may be in a range from 10 nm to 50 nm, such as from 12 nm to 35 nm and/or from 15 nm to 25 nm. Generally, the dielectric metal oxide liner 44B may include any one or more of the dielectric metal oxide materials described above, and may have a thickness in a range from 10 nm to 50 nm, such as from 12 nm to 35 nm and/or from 15 nm to 25 nm. In one embodiment, the planarization process that forms the bottom gate electrode 15 may be selective to the material of the dielectric metal oxide liner 44B such that the dielectric metal oxide liner 44B covers, and overlies, a horizontally-extending portion of the silicon nitride liner 44A outside the area of the bottom gate dielectric 10.

Figure 22A:
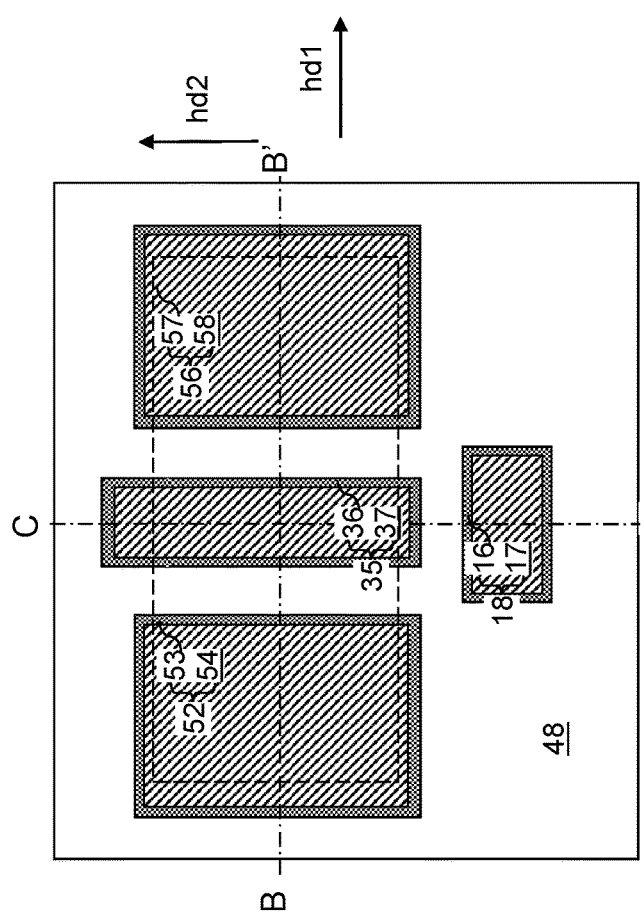
FIG. 22A is a top-down view of a region of a third alternative configuration of the second exemplary structure after formation of a source electrode, a drain electrode, and a backside electrode contact via structure according to the second embodiment of the present disclosure.
Figure 22B:
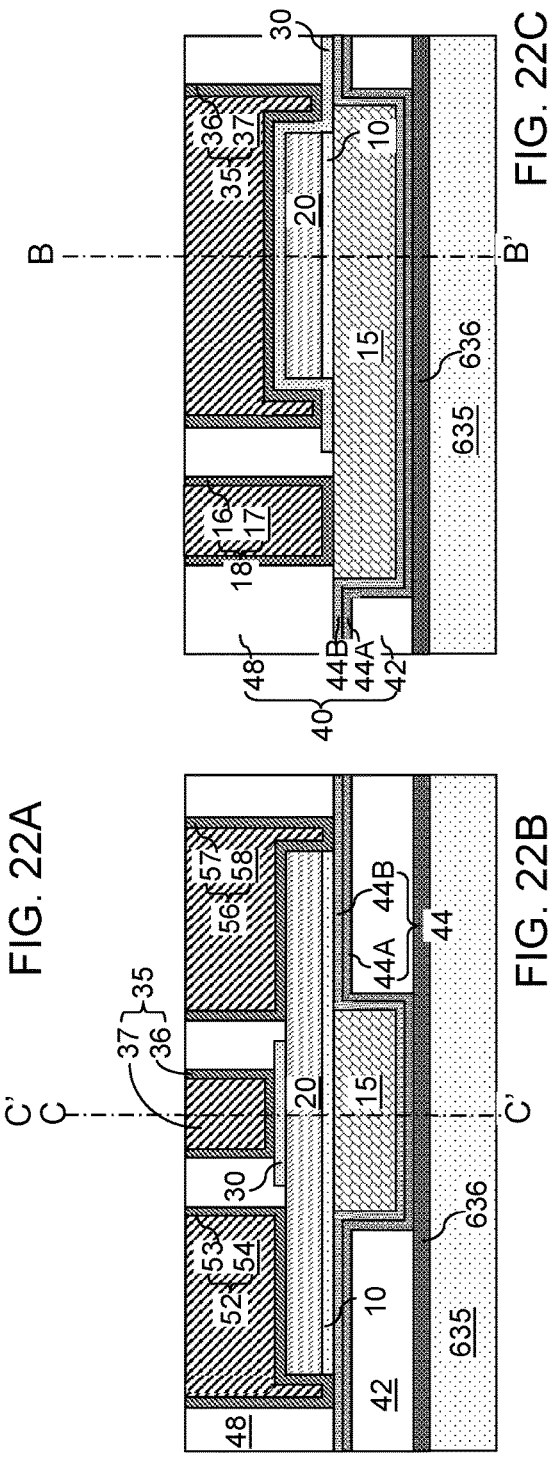
FIG. 22B is a vertical cross-sectional view of the second exemplary structure along the vertical plane B-B' of FIG. 22A.
Figure 22C:
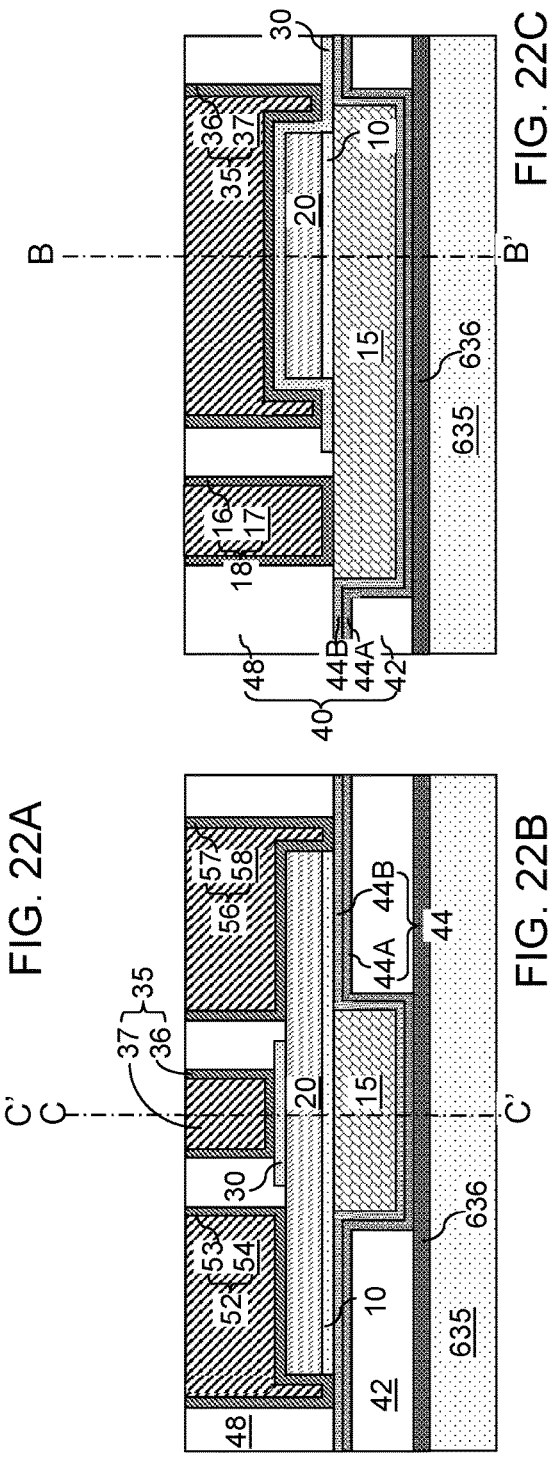
FIG. 22C is a vertical cross-sectional view of the second exemplary structure along the vertical plane C-C' of FIG. 22A.

Referring to FIGS. 22A-22C, a third alternative configuration of the second exemplary structure according to the second embodiment of the present disclosure may be derived from the second alternative configuration of the second exemplary structure illustrated in FIGS. 21A-21C by omitting formation of the capping hydrogen-blocking dielectric barrier layer 46. In this embodiment, the electrode-level dielectric material layer 48 may be formed directly on the semiconducting metal oxide plate 20 and on physically exposed surfaces of the bottom gate dielectric 10, the bottom gate electrode 48, and the hydrogen-blocking dielectric barrier layer 44.

Figure 23A:
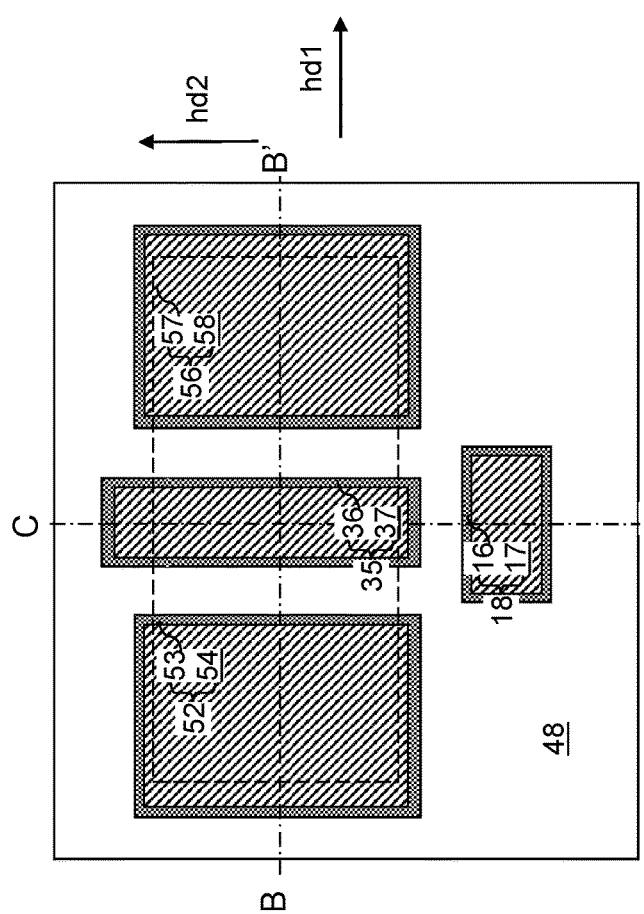
FIG. 23A is a top-down view of a region of a fourth alternative configuration of the second exemplary structure after formation of a source electrode, a drain electrode, and a backside electrode contact via structure according to the second embodiment of the present disclosure.
Figure 23B:
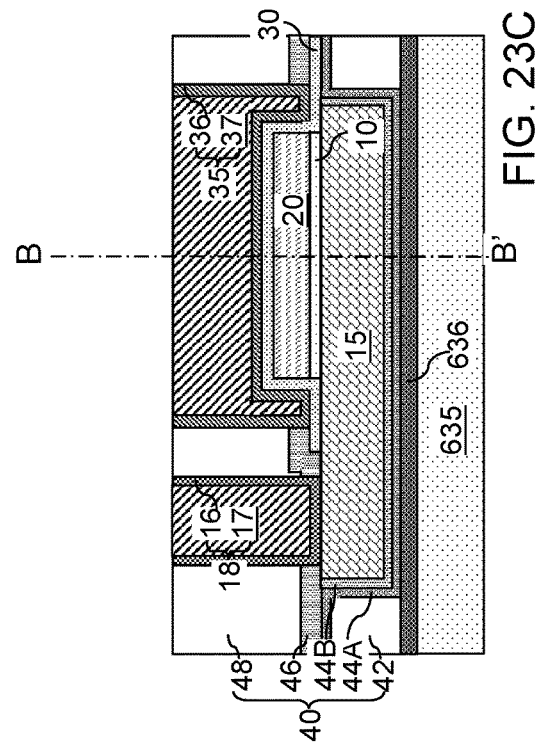
FIG. 23B is a vertical cross-sectional view of the second exemplary structure along the vertical plane B-B' of FIG. 23A.
Figure 23C:
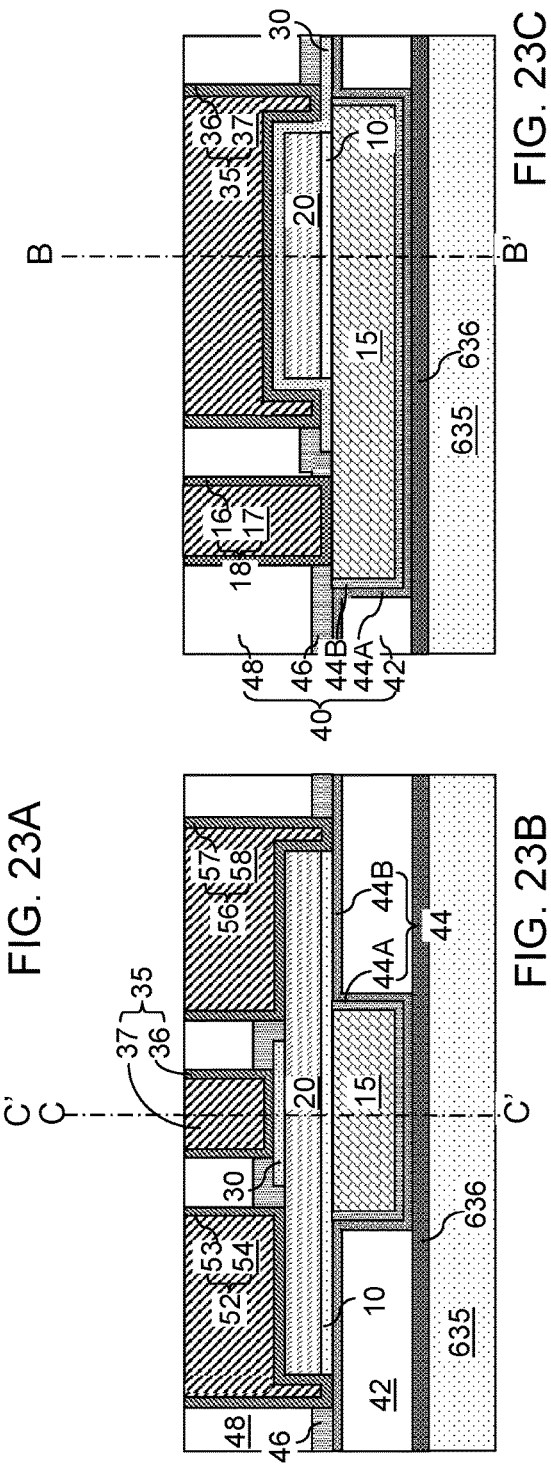
FIG. 23C is a vertical cross-sectional view of the second exemplary structure along the vertical plane C-C' of FIG. 23A.

Referring to FIGS. 23A-23C, a fourth alternative configuration of the second exemplary structure according to the second embodiment of the present disclosure may be derived from the second exemplary structure of FIGS. 19A-19C by using a layer stack for the hydrogen-blocking dielectric barrier layer 44. In this embodiment, the hydrogen-blocking dielectric barrier layer 44 may include a layer stack including, from bottom to top, a dielectric metal oxide liner 44B and a silicon nitride liner 44A. The dielectric metal oxide liner 44B may include any dielectric metal oxide material that may be used for the dielectric metal oxide liner of the hydrogen-blocking dielectric barrier layer 44 illustrated in FIGS. 4A-4C and described above. The silicon nitride liner 44A comprises, and/or consists essentially of, silicon nitride, and may have a thickness in a range from 2 nm to 20 nm, such as from 2 nm to 10 nm.

The horizontally-extending portion of the silicon nitride liner 44A that overlies the insulating matrix layer 42 may be removed during a planarization process that forms the bottom gate electrode 15. For example, the planarization process used to form the bottom gate electrode 15 may include a chemical mechanical polishing step that collaterally removes the horizontally-extending portion of the silicon nitride liner 44A during polishing of the at least one metallic material of the bottom gate electrode 15. The top surface of the horizontally-extending portion of the dielectric metal oxide liner 44B may be physically exposed outside the area of the bottom gate electrode 15 after the chemical mechanical polishing process. The bottom gate dielectric 10, the source electrode 52, the drain electrode 56, and the capping hydrogen-blocking dielectric barrier layer 46 may be formed directly on a top surface of the dielectric metal oxide liner 44B. Contact between the silicon nitride liner 44A and the bottom gate dielectric 10 may be minimized to two strips that laterally extend along the second horizontal direction hd2.

Subsequently, the processing steps of FIGS. 15A-19C may be performed to form the fourth alternative configuration of the second exemplary structure illustrated in FIGS. 23A-23C.

Referring to FIGS. 24A-24C, a fifth alternative configuration of the second exemplary structure according to the second embodiment of the present disclosure may be derived from the fourth alternative configuration of the second exemplary structure illustrated in FIGS. 23A-23C by omitting formation of the capping hydrogen-blocking dielectric barrier layer 46. In this embodiment, the electrode-level dielectric material layer 48 may be formed directly on the semiconducting metal oxide plate 20 and on physically exposed surfaces of the bottom gate dielectric 10, the bottom gate electrode 48, and the hydrogen-blocking dielectric barrier layer 44.

Referring to FIGS. 25A-25C, a third exemplary structure according to a third embodiment of the present disclosure can be derived from the first exemplary structure illustrated in FIGS. 2A-2C by forming a layer stack of a hydrogen-blocking dielectric barrier layer 44 and a gate electrode layer 15L. The hydrogen-blocking dielectric barrier layer 44 may have the same material composition and the same thickness range as in the first and second embodiments. Further, the hydrogen-blocking dielectric barrier layer 44 may be formed employing a same deposition method as in the first and second embodiments.

The gate electrode layer 15L includes the same material as, and may have the same thickness range as, the gate electrode 15 in the first and second embodiments. The gate electrode layer 15L may be deposited by a conformal or non-conformal deposition process, such as a chemical vapor deposition process, a physical vapor deposition process, or an atomic layer deposition process.

Referring to FIGS. 26A-26C, the gate electrode layer 15L and the hydrogen-blocking dielectric barrier layer 44 may be patterned, for example, by applying and lithographically patterning a photoresist layer (not shown), and by transferring the pattern in the photoresist layer through the hydrogen-blocking dielectric barrier layer 44 and the gate electrode layer 15L employing an anisotropic etch process such as a reactive ion etch process. A patterned portion of the gate electrode layer 15L constitutes a gate electrode 15. Generally, the gate electrode 15 in the third exemplary structure may have the same size and the shape as any of the gate electrodes in the first and second exemplary structures. The hydrogen-blocking dielectric barrier layer 44 may have the same size and the same shape as the gate electrode 15. In one embodiment, a periphery of a top surface of the hydrogen-blocking dielectric barrier layer 44 may coincide with a periphery of a bottom surface of the gate electrode 15.

An insulating matrix layer 42 may be formed by depositing a dielectric material over the stack of the hydrogen-blocking dielectric barrier layer 44 and the gate electrode 15, and by removing portions of the deposited dielectric material from above a horizontal plane including the top surface of the gate electrode 15 employing a planarization process such as a chemical mechanical polishing (CMP) process. The top surface of the insulating matrix layer 42 may be coplanar with the top surface of the gate electrode. Generally, the hydrogen-blocking dielectric barrier layer 44 may have a same area as the gate electrode 15, and the gate electrode contacts sidewalls of the insulating matrix layer 42 in the third exemplary structure. The insulating matrix layer 42 includes an opening, within which a stack of the hydrogen-blocking dielectric barrier layer 44 and the gate electrode 15 is located.

Subsequently, the processing steps described with reference to FIGS. 6A-14C may be employed to provide the third exemplary structure illustrated in FIGS. 27A-27C, or any of variants incorporating any of the features of the first exemplary structure provided above the horizontal plane including the top surface of the insulating matrix layer 42.

Alternatively, the processing steps described with reference to FIGS. 15A-24C may be employed to provide the alternative embodiment of the third exemplary structure illustrated in FIGS. 28A-28C, or any of variants incorporating any of the features of the first exemplary structure provided above the horizontal plane including the top surface of the insulating matrix layer 42.

Figure 28:
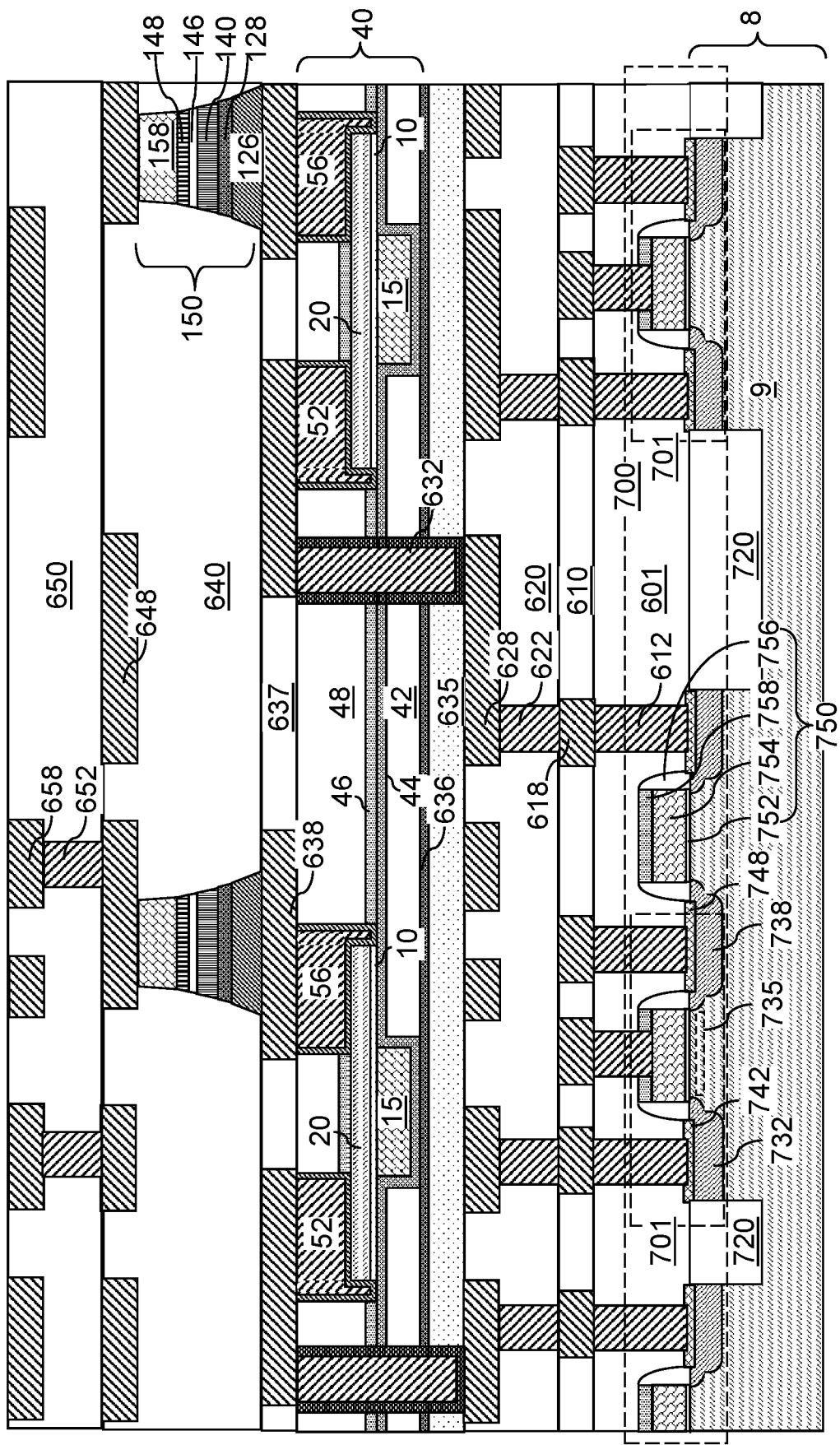
FIG. 28 is a vertical cross-sectional view of the exemplary structure after formation of memory cells according to an embodiment of the present disclosure.

Referring to FIG. 28, an exemplary structure is illustrated after formation of thin film transistors. The exemplary structure may be derived from the first exemplary structures illustrated in FIGS. 9A-14C or from the second exemplary structures illustrated in FIGS. 19A-24C. For example, second metal via structures 632 may be formed may be formed through the TFT-level dielectric material layer 40 and the planar insulating spacer layer 635 on a respective one of the second metal line structures 628 concurrent with, before, or after, formation of the source electrodes 52, the drain electrodes 56, the optional top gate electrodes 35, and the backside electrode contact via structures 18.

A dielectric material layer, which is herein referred to as a third line-level dielectric material layer 637, may be deposited over the TFT-level dielectric material layer 40. Third metal line structures 638 may be formed in the third line-level dielectric material layer 637 on a respective one of the metallic structures (52, 56, 35, 18) embedded within the TFT-level dielectric material layer 40.

Additional metal interconnect structures embedded in additional dielectric material layers may be subsequently formed over the thin film transistors and the third line-level dielectric material layer 637. In an illustrative example, the dielectric material layers may include, for example, a fourth interconnect-level dielectric material layer 640, a fifth interconnect-level dielectric material layer 650, etc. The additional metal interconnect structures may include third metal via structures (not illustrated) and fourth metal lines 648 embedded in the fourth interconnect-level dielectric material layer 640, fourth metal via structures 652 and fifth metal line structures 658 embedded in the fifth interconnect-level dielectric layer 650, etc.

Optionally, memory cells 150 may be formed below, above, or at the same level as, the thin film transistors. In embodiments in which the thin film transistors are formed as a two-dimensional periodic array, the memory cells 150 may be formed as a two-dimensional periodic array of memory cells 150. Each memory cell 150 may comprises a magnetic tunnel junction, a ferroelectric tunnel junction, a phase change memory material, or a vacancy-modulated conductive oxide material portion. Further, each memory cell 150 may include a first electrode 126 including a metallic material, and a second electrode 158 including a metallic material and protecting an underlying data-storing portion of the memory cell 150. A memory element is provided between the first electrode 126 (i.e., bottom electrode) and the second electrode 158 (i.e., top electrode).

In an illustrative example, in embodiments in which the memory cell 150 includes a magnetic tunnel junction, the memory cell 150 may include a layer stack including, from bottom to top, a first electrode 126, a metallic seed layer 128 that facilitates crystalline growth of overlying material layers, a synthetic antiferromagnet (SAF) structure 140, a tunneling barrier layer 146, a free magnetization layer 148, and a second electrode 158. While the present disclosure is described using an embodiment in which the thin film transistors are used as access transistors for memory cells 150, embodiments are expressly contemplated herein in which the thin film transistors are used as logic devices, as components of a peripheral circuit for a memory array, or for any other semiconductor circuitry.

In one embodiment, the substrate 8 comprises a single crystalline silicon substrate. Lower-level dielectric material layers (601, 610, 620) embedding lower-level metal interconnect structures (612, 618, 622, 628) may be located between the single crystalline silicon substrate and the insulating matrix layer 42. Field effect transistors 701 including a respective portion of the single crystalline silicon substrate as a channel may be embedded within the lower-level dielectric material layers (601, 610, 620), and may be electrically connected to at least one of the gate electrodes (15, 35), the source electrodes 52, and the drain electrodes 56.

Figure 29:
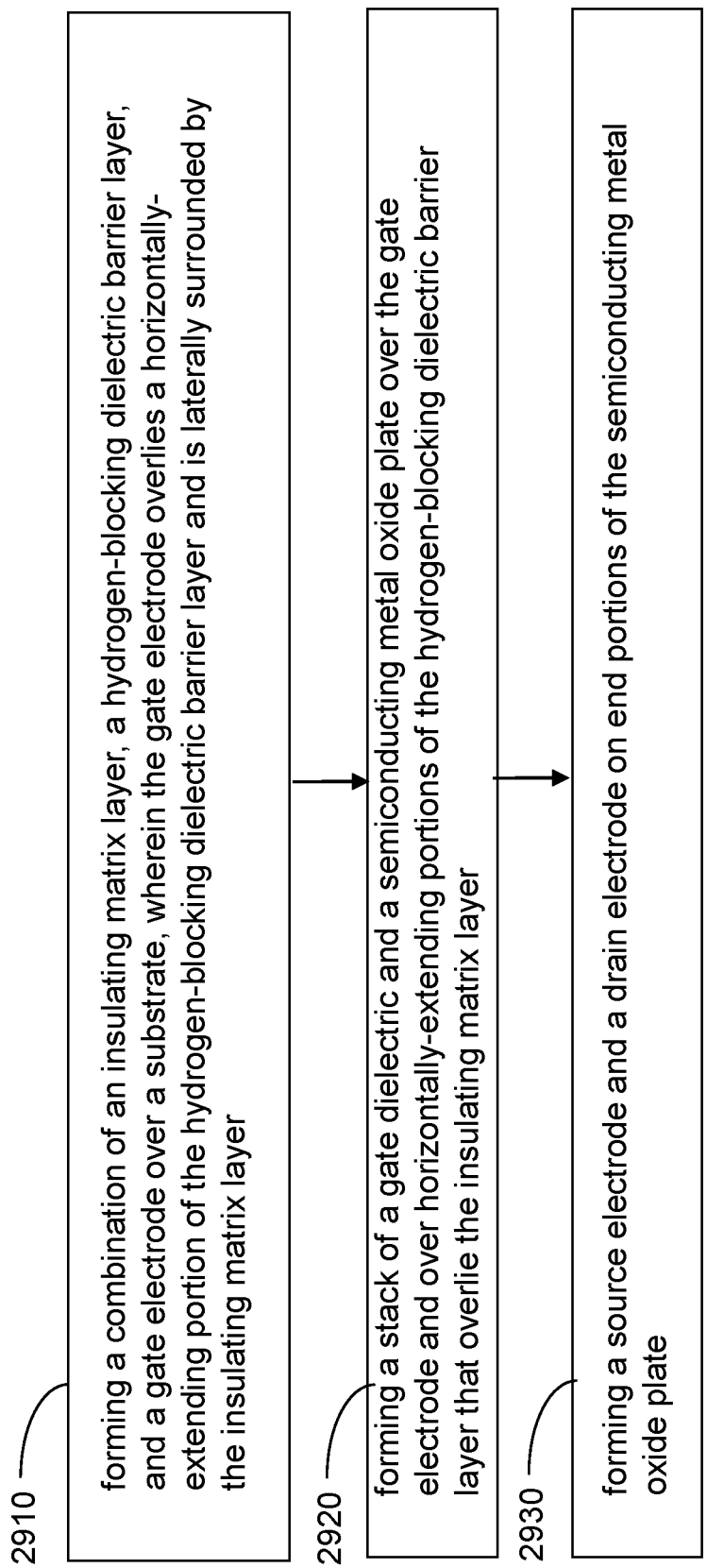
FIG. 29 is a flowchart that illustrates the general processing steps for manufacturing the semiconductor device of the present disclosure.

FIG. 29 is a flowchart that illustrates the general processing steps for manufacturing the semiconductor device of the present disclosure. Referring to step 2910 and FIGS. 1-5C, 10A-14C, 15A-15C, 20A-24C, and 25A-27C, a combination of an insulating matrix layer 42, a hydrogen-blocking dielectric barrier layer 44, and a gate electrode 15 may be formed over a substrate 8. The gate electrode 15 overlies a horizontally-extending portion of the hydrogen-blocking dielectric barrier layer 44 and is laterally surrounded by the insulating matrix layer 42. For example, an insulating matrix layer 42 may be formed over a substrate 8. An opening 11 may be formed in an upper portion of the insulating matrix layer 42. A hydrogen-blocking dielectric barrier layer 44 may be formed on physically exposed surfaces of the insulating matrix layer 42 in the opening 11 and over a top surface of the insulating matrix layer 42. A gate electrode (such as a bottom gate electrode 15) may be formed within the opening 11 on the hydrogen-blocking dielectric barrier layer 44. Alternatively, a stack of a hydrogen-blocking dielectric barrier layer 44 and a gate electrode 15 can be formed over a substrate 8, and an insulating matrix layer 42 can be subsequently formed around the stack of the hydrogen-blocking dielectric barrier layer 44 and the gate electrode 15.

Referring to step 2920 and FIGS. 6A-6C, 10A-14C, 15A-15C, 20A-24C, and 26A-27C, a stack of a gate dielectric (such as a bottom gate dielectric 10) and a semiconducting metal oxide plate 20 may be formed over the gate electrode (such as the bottom gate electrode 15) and over horizontally-extending portions of the hydrogen-blocking dielectric barrier layer 44 that overlie the insulating matrix layer 42.

Referring to step 2930 and FIGS. 7A-14C, 16A-24C, and 26A-27C, a source electrode 52 and a drain electrode 58 may be formed on end portions of the semiconducting metal oxide plate 20.

Referring collectively to FIGS. 1-29 and according to various embodiments of the present disclosure, a semiconductor device is provided, which comprises: an insulating matrix layer 42 including an opening 11 therein and overlying a substrate 8; a hydrogen-blocking dielectric barrier layer 44 extending over a horizontal plane including a bottom surface of the insulating matrix layer 42; a gate electrode (such as a bottom gate electrode 15) overlying a portion of the hydrogen-blocking dielectric barrier layer 44; a stack of a gate dielectric (such as a bottom gate dielectric 10) and a semiconducting metal oxide plate 20 overlying a top surface of the gate electrode (such as the bottom gate electrode 15) and horizontally-extending portions of the hydrogen-blocking dielectric barrier layer 44 that overlie the insulating matrix layer 42; and a source electrode 52 and a drain electrode 56 contacting a respective portion of a top surface of the semiconducting metal oxide plate 20.

In one embodiment, a semiconductor device comprising a thin film transistor located over a substrate 8 is provided. The thin film transistor comprises: an insulating matrix layer 42 including an opening 11 therein and overlying a substrate 8; a hydrogen-blocking dielectric barrier layer 44 continuously extending over a horizontal plane including a bottom surface of the insulating matrix layer 42, over sidewalls of the opening, and over a top surface of the insulating matrix layer 42; a gate electrode (such as a bottom gate electrode 15) located within the opening 11 on the hydrogen-blocking dielectric barrier layer 44; a stack of a gate dielectric (such as a bottom gate dielectric 10) and a semiconducting metal oxide plate 20 overlying a top surface of the gate electrode (such as the bottom gate electrode 15) and horizontally-extending portions of the hydrogen-blocking dielectric barrier layer 44 that overlie the insulating matrix layer 42; and a source electrode 52 and a drain electrode 56 contacting a respective portion of a top surface of the semiconducting metal oxide plate 20.

In one embodiment, the source electrode 52 overlies a first horizontally-extending portion of the hydrogen-blocking dielectric barrier layer 44; and the drain electrode 56 overlies a second horizontally-extending portion of the hydrogen-blocking dielectric barrier layer 44 that is laterally spaced from the first horizontally-extending portion of the hydrogen-blocking dielectric barrier layer 44 by an intervening horizontally-extending portion of the hydrogen-blocking dielectric barrier layer 44 that underlies the gate electrode (such as the bottom gate electrode 15).

In one embodiment, the hydrogen-blocking dielectric barrier layer 44 comprises, and/or consists of, a dielectric metal oxide liner (44 or 44B) including a dielectric metal oxide material, is in contact with a first region of a bottom surface of the gate dielectric (such as the bottom gate dielectric 10) underlying the source electrode 52, and is in contact with a second region of the bottom surface of the gate dielectric (such as the bottom gate dielectric 10) that underlies the drain electrode 56 and is laterally spaced from the first region of the bottom surface of the gate dielectric (such as the bottom gate dielectric 10) by the gate electrode (such as the bottom gate electrode 15).

In one embodiment, the dielectric metal oxide liner (as embodied as the hydrogen-blocking dielectric barrier layer 44 in FIGS. 9A-10C and 19A-20C or as the dielectric metal oxide liner 44B in FIGS. 13A-14C and 23A-24C) is in direct contact with the insulating matrix layer 42 at the sidewalls of the opening 11.

In one embodiment, the hydrogen-blocking dielectric barrier layer 44 comprises a silicon nitride liner in direct contact with the insulating matrix layer 42 at the sidewalls of the opening 11 as illustrated in FIGS. 11A-12C and 21A-22C.

In one embodiment, the hydrogen-blocking dielectric barrier layer 44 comprises a silicon nitride liner 44A in contact with the gate electrode (such as the bottom gate electrode 15) and spaced from the insulating matrix layer 42 by the dielectric metal oxide liner 44B as illustrated in FIGS. 13A-14C and 23A-24C.

In one embodiment, the dielectric metal oxide liner (44 or 44B) comprises a material selected from aluminum oxide and a dielectric transition metal oxide.

In one embodiment, the semiconductor device comprises a capping hydrogen-blocking dielectric barrier layer 46 comprising a capping dielectric metal oxide material and contacting a portion of a top surface of the portion of the semiconducting metal oxide plate 20.

In one embodiment, each surface of the semiconducting metal oxide plate 20 is in contact with a respective surface selected from a top surface of the gate dielectric (such as the bottom gate dielectric 10), surfaces of the source electrode 52, surfaces of the drain electrode 56, and a bottom surface of the capping hydrogen-blocking dielectric barrier layer 46.

In one embodiment, the source electrode 52 contacts a first sidewall of the gate dielectric (such as the bottom gate dielectric 10), a first end sidewall of the semiconducting metal oxide plate 20, and a first region of a top surface of the semiconducting metal oxide plate 20, and the drain electrode 56 contacts a second sidewall of the gate dielectric (such as the bottom gate dielectric 10), a second end sidewall of the semiconducting metal oxide plate 20, and a second region of the top surface of the semiconducting metal oxide plate 20.

According to another aspect of the present disclosure, a semiconductor device comprising a thin film transistor located over a substrate is provided. The thin film transistor comprises: an insulating matrix layer 42 including an opening 11 therein and overlying a substrate 8; a hydrogen-blocking dielectric barrier layer 44 continuously extending over a bottom surface and sidewalls of the opening 11 and over a top surface of the insulating matrix layer 42; a bottom gate electrode 15 located within the opening 11 on the hydrogen-blocking dielectric barrier layer 44; a stack of a bottom gate dielectric 10 and a semiconducting metal oxide plate 20 overlying a top surface of the bottom gate electrode 15 and horizontally-extending portions of the hydrogen-blocking dielectric barrier layer 44 that overlie the insulating matrix layer 42; a stack of a top gate dielectric 30 and a top gate electrode 35 overlying the bottom gate electrode 15 and having an areal overlap with the bottom gate electrode 15 in a plan view (i.e., in a see-through view along the vertical direction that is perpendicular to the top surface of the substrate 8); and a source electrode 52 and a drain electrode 56 contacting a respective portion of a top surface of the semiconducting metal oxide plate 20.

In one embodiment, the semiconductor device comprises: a dielectric material layer (such as an electrode-level dielectric material layer 48) laterally surrounding the stack of the bottom gate dielectric 10 and the semiconducting metal oxide plate 20; and a backside electrode contact via structure 18 contacting a top surface of the bottom gate electrode 15, wherein top surfaces of the source electrode 52, the drain electrode 56, the top gate electrode 35, and the backside electrode contact via structure 18 are located within a horizontal plane including a top surface of the dielectric material layer (such as the electrode-level dielectric material layer 48).

In one embodiment, the hydrogen-blocking dielectric barrier layer 44 comprises a dielectric metal oxide liner (44 or 44B) including a dielectric metal oxide material in contact with a first region of a bottom surface of the bottom gate dielectric 10 and in contact with a second region of the bottom surface of the bottom gate dielectric 10 that is laterally spaced from the first region of the bottom surface of the bottom gate dielectric by the bottom gate electrode 15.

In one embodiment, the semiconductor device comprises a capping hydrogen-blocking dielectric barrier layer 46 contacting a first portion of a top surface of the semiconducting metal oxide plate 20 located between the top gate dielectric 30 and the source electrode 52 and contacting a second portion of the top surface of the semiconducting metal oxide plate 20 located between the top gate dielectric 30 and the drain electrode 56.

The various embodiments of the present disclosure may be used to reduce hydrogen diffusion into the semiconducting metal oxide plate 20 by providing hydrogen-diffusion barrier structures including the hydrogen-blocking dielectric barrier layer 44, the optional capping hydrogen-blocking dielectric barrier layer 46, the source electrode 52, the drain electrode 56, and the optional top gate electrode 35. Blocking hydrogen diffusion into the semiconducting metal oxide plate 20 prevents changes in the electronic surface states within the semiconducting metal oxide plate 20, and thus, maintains the device characteristics of the thin film transistor constant throughout the operational lifetime of the thin film transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
    an insulating matrix layer including an opening therein and overlying a substrate;
    a hydrogen-blocking dielectric barrier layer extending over a horizontal plane including a bottom surface of the insulating matrix layer;
    a gate electrode located within the opening on the hydrogen-blocking dielectric barrier layer, wherein the hydrogen-blocking dielectric barrier layer comprises a first horizontally-extending portion that underlies the gate electrode;
    a stack of a gate dielectric and a semiconducting metal oxide plate overlying a top surface of the gate electrode and horizontally-extending portions of the hydrogen-blocking dielectric barrier layer that overlie the insulating matrix layer; and
    a source electrode and a drain electrode contacting respective portions of a top surface of the semiconducting metal oxide plate.

2. The semiconductor device of claim 1, wherein:
    the hydrogen-blocking dielectric barrier layer has a same area as the gate electrode; and
    the gate electrode contacts sidewalls of the insulating matrix layer.

3. The semiconductor device of claim 1, wherein:
    the substrate comprises a single crystalline silicon substrate;
    lower-level dielectric material layers embedding lower-level metal interconnect structures are located between the single crystalline silicon substrate and the insulating matrix layer; and
    field effect transistors including a respective portion of the single crystalline silicon substrate as a channel are embedded within the lower-level dielectric material layers, and are electrically connected to at least one of the gate electrode, the source electrode, and the drain electrode.

4. The semiconductor device of claim 1, further comprising a capping hydrogen-blocking dielectric barrier layer comprising a capping dielectric metal oxide material and contacting a portion of a top surface of the semiconducting metal oxide plate.

5. The semiconductor device of claim 4, wherein each surface of the semiconducting metal oxide plate is in contact with a respective surface selected from a top surface of the gate dielectric, surfaces of the source electrode, surfaces of the drain electrode, and a bottom surface of the capping hydrogen-blocking dielectric barrier layer.

6. The semiconductor device of claim 4, wherein:
    the source electrode contacts a first sidewall of the gate dielectric and a first region of a top surface of the semiconducting metal oxide plate; and
    the drain electrode contacts a second sidewall of the gate dielectric and a second region of the top surface of the semiconducting metal oxide plate.

7. The semiconductor device of claim 1, wherein the hydrogen-blocking dielectric barrier layer continuously extends over sidewalls of the opening and over a top surface of the insulating matrix layer.

8. The semiconductor device of claim 7, wherein:
    the source electrode overlies a first horizontally-extending portion of the hydrogen-blocking dielectric barrier layer; and
    the drain electrode overlies a second horizontally-extending portion of the hydrogen-blocking dielectric barrier layer that is laterally spaced from the first horizontally-extending portion of the hydrogen-blocking dielectric barrier layer by an intervening horizontally-extending portion of the hydrogen-blocking dielectric barrier layer that underlies the gate electrode.

9. The semiconductor device of claim 8, wherein the hydrogen-blocking dielectric barrier layer comprises a dielectric metal oxide liner including a dielectric metal oxide material, in contact with a first region of a bottom surface of the gate dielectric underlying the source electrode, and in contact with a second region of the bottom surface of the gate dielectric that underlies the drain electrode and is laterally spaced from the first region of the bottom surface of the gate dielectric by the gate electrode.

10. The semiconductor device of claim 9, wherein the semiconductor device comprises a feature selected from:
    a first feature that the dielectric metal oxide liner is in direct contact with the insulating matrix layer at the sidewalls of the opening;
    a second feature that the hydrogen-blocking dielectric barrier layer comprises a silicon nitride liner in direct contact with the insulating matrix layer at the sidewalls of the opening; and
    a third feature that the hydrogen-blocking dielectric barrier layer comprises a silicon nitride liner in contact with the gate electrode and spaced from the insulating matrix layer by the dielectric metal oxide liner.

11. The semiconductor device of claim 9, wherein the dielectric metal oxide liner comprises a material selected from aluminum oxide and a dielectric transition metal oxide.

12. A semiconductor device comprising a thin film transistor located over a substrate, wherein the thin film transistor comprises:
    an insulating matrix layer including an opening therein and overlying a substrate;
    a hydrogen-blocking dielectric barrier layer continuously extending over a horizontal plane including a bottom surface of the insulating matrix layer, over sidewalls of the opening, and over a top surface of the insulating matrix layer;
    a bottom gate electrode located within the opening on the hydrogen-blocking dielectric barrier layer, wherein the hydrogen-blocking dielectric barrier layer comprises a first horizontally-extending portion that underlies the bottom gate electrode;
    a stack of a bottom gate dielectric and a semiconducting metal oxide plate overlying a top surface of the bottom gate electrode and horizontally-extending portions of the hydrogen-blocking dielectric barrier layer that overlie the insulating matrix layer;

a stack of a top gate dielectric and a top gate electrode overlying the bottom gate electrode and having an areal overlap with the bottom gate electrode in a plan view; and a source electrode and a drain electrode contacting a respective portion of a top surface of the semiconducting metal oxide plate.

13. The semiconductor device of claim 12, further comprising:

a dielectric material layer laterally surrounding the stack of the bottom gate dielectric and the semiconducting metal oxide plate; and a backside electrode contact via structure contacting a top surface of the bottom gate electrode, wherein top surfaces of the source electrode, the drain electrode, the top gate electrode, and the backside electrode contact via structure are located within a horizontal plane including a top surface of the dielectric material layer.

14. The semiconductor device of claim 12, wherein the hydrogen-blocking dielectric barrier layer comprises a dielectric metal oxide liner including a dielectric metal oxide material in contact with a first region of a bottom surface of the bottom gate dielectric and in contact with a second region of the bottom surface of the bottom gate dielectric that is laterally spaced from the first region of the bottom surface of the bottom gate dielectric by the bottom gate electrode.

15. The semiconductor device of claim 12, further comprising a capping hydrogen-blocking dielectric barrier layer contacting a first portion of a top surface of the semiconducting metal oxide plate located between the top gate dielectric and the source electrode and contacting a second portion of the top surface of the semiconducting metal oxide plate located between the top gate dielectric and the drain electrode.

16. A method of forming a semiconductor device, comprising:

forming a combination of an insulating matrix layer, a hydrogen-blocking dielectric barrier layer, and a gate electrode over a substrate, wherein the gate electrode overlies a horizontally-extending portion of the hydrogen-blocking dielectric barrier layer and is laterally surrounded by the insulating matrix layer, and wherein the hydrogen-blocking dielectric barrier layer comprises a first horizontally-extending portion that underlies the gate electrode;

forming a stack of a gate dielectric and a semiconducting metal oxide plate over the gate electrode and over horizontally-extending portions of the hydrogen-blocking dielectric barrier layer that overlie the insulating matrix layer; and forming a source electrode and a drain electrode on end portions of the semiconducting metal oxide plate.

17. The method of claim 16, further comprising forming a dielectric material layer over the semiconducting metal oxide plate directly on a portion of a top surface of the hydrogen-blocking dielectric barrier layer, wherein the source electrode and the drain electrode are formed through the dielectric material layer.

18. The method of claim 16, further comprising forming an opening in an upper portion of the insulating matrix layer, wherein:

the hydrogen-blocking dielectric barrier layer is formed on physically exposed surfaces of the insulating matrix layer in the opening and over a top surface of the insulating matrix layer; and the gate electrode is formed within the opening on the hydrogen-blocking dielectric barrier layer.

19. The method of claim 18, wherein:

the hydrogen-blocking dielectric barrier layer comprises a dielectric metal oxide liner including a dielectric metal oxide material;

the gate dielectric is formed directly on a top surface of the gate electrode and directly on horizontally-extending portions of the dielectric metal oxide liner; and the dielectric metal oxide liner comprises a material selected from aluminum oxide and a dielectric transition metal oxide.

20. The method of claim 18, further comprising forming a capping hydrogen-blocking dielectric barrier layer comprising an additional dielectric metal oxide material on a top surface of the portion of the semiconducting metal oxide plate.

* * * * *